United States Patent
Hsu et al.

(10) Patent No.: US 10,268,293 B2
(45) Date of Patent: Apr. 23, 2019

(54) IMAGE DISPLAY SYSTEMS AND GATE DRIVING CIRCUITS THAT INCLUDE A COMPENSATION CIRCUIT AND SHIFT REGISTERS

(71) Applicant: InnoLux Corporation, Miao-Li County (TW)

(72) Inventors: Wen-Tsai Hsu, Miao-Li County (TW); Wei-Kuang Lien, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 225 days.

(21) Appl. No.: 15/191,182

(22) Filed: Jun. 23, 2016

(65) Prior Publication Data

US 2016/0378232 A1 Dec. 29, 2016

(30) Foreign Application Priority Data

Jun. 25, 2015 (TW) .............................. 104120474 A

(51) Int. Cl.
*G06F 3/045* (2006.01)
*G06F 3/041* (2006.01)
(Continued)

(52) U.S. Cl.
CPC .......... *G06F 3/0412* (2013.01); *G06F 3/0416* (2013.01); *G09G 3/3677* (2013.01);
(Continued)

(58) Field of Classification Search
None
See application file for complete search history.

(56) References Cited

U.S. PATENT DOCUMENTS

| | | | |
|---|---|---|---|
| 2003/0128180 A1* | 7/2003 | Kim | G09G 3/3677 345/100 |
| 2013/0241814 A1* | 9/2013 | Hirabayashi | G09G 3/3677 345/100 |
| 2016/0365061 A1* | 12/2016 | Hong | G06F 3/041 |

FOREIGN PATENT DOCUMENTS

CN 103310748 A 9/2013

OTHER PUBLICATIONS

Google.com, definition of shift register, www.google.com, p. 1.*
Google.com, definition of shift register, 2018, www.google.com, p. 1 (Year: 2018).*

* cited by examiner

*Primary Examiner* — Abdul-Samad A Adediran
*Assistant Examiner* — Kirk W Hermann
(74) *Attorney, Agent, or Firm* — McClure, Qualey & Rodack, LLP

(57) ABSTRACT

A gate driving circuit includes a plurality of shift registers arranged to output the gate driving signals in sequence. The shift registers are divided into groups arranged in sequence, wherein the driving signal from a first one of a N+1$^{th}$ group of shift registers is next to the driving signal from a first one of a N$^{th}$ group of shift registers; and at least one first compensation circuit connected to the last one of the N$^{th}$ group of shift registers and the first one of the N+1$^{th}$ group of shift registers, wherein the first compensation circuit provides a first control signal to enable the last one of the N$^{th}$ group of shift registers to perform signal holding, and provides a second control signal to enable the first one of the N+1$^{th}$ group of shift registers to perform pre-charging, wherein N is an integer greater than zero.

18 Claims, 18 Drawing Sheets

(51) Int. Cl.
*G09G 3/36* (2006.01)
*G06F 3/044* (2006.01)
*G11C 19/28* (2006.01)

(52) U.S. Cl.
CPC ..... *G06F 3/044* (2013.01); *G09G 2300/0426* (2013.01); *G09G 2310/021* (2013.01); *G09G 2310/0216* (2013.01); *G09G 2310/0267* (2013.01); *G09G 2310/0283* (2013.01); *G09G 2310/0286* (2013.01); *G09G 2310/08* (2013.01); *G11C 19/28* (2013.01)

IMAGE DISPLAY SYSTEMS AND GATE DRIVING CIRCUITS THAT INCLUDE A COMPENSATION CIRCUIT AND SHIFT REGISTERS

CROSS REFERENCE TO RELATED APPLICATIONS

This Application claims priority of Taiwan Patent Application No. 104120474, filed on Jun. 25, 2015, the entirety of which is incorporated by reference herein.

BACKGROUND OF THE INVENTION

Field of the Invention

The present invention relates to a shift register module, and in particular to a gate driving circuit integrated with a touch display panel.

Description of the Related Art

Shift registers are used widely in data transmission circuits for controlling the timing of receiving data signals at respective data lines, and they are used in gate driving circuits for generating gate driving signals at respective gate lines. In data transmission circuits, the shift registers are arranged to output a selection signal to respective data lines, and image data can be written into respective data lines in sequence. Furthermore, in gate driving circuits, the shift registers are arranged to provide a scan signal to a respective gate line to turn on the pixels of the pixel matrix in sequence, so that the image signal can be written to the respective data lines.

Recently, amorphous silicon TFT gate driver circuit (ASG) technology has been developed. In ASG technology, a gate driving circuit comprising thin film transistors (TFTs) is directly integrated into the display panel (i.e., the glass substrate of the display) during the amorphous silicon TFT process to take the place of gate driver chips. This technology also is called gate driver on panel (GOP) technology. Thus, the fabrication cost and cycle time can be reduced by ASG technology or GOP technology to reduce the use of chips in the display panel.

In current in-cell touch display panels, the touch function is integrated into the display pixels, and thus, there is no need to include a touch device other than display pixels into the display panel. For example, the touch function is integrated into liquid-crystal display (LCD) pixels or OLED pixels, and the touch function is implemented by using the electrode structures of the display pixel, so there is no need for additional touch structures. For example, when the in-cell touch display panel is a fringe field switch (FFS) LCD device, its common electrodes are usually patterned and divided into several portions to serve as touch sensing electrodes, so that the overall thickness and weight of the touch display panel can be reduced. Because the touch function is integrated into the LCD display pixels, each frame should be divided to include one or more touch sensing periods for touch detection. However, during the touch sensing periods, clock signals provided to the shift registers in the gate driving circuit are suspended or paused, and the rising edges or falling edges of gate driving signals from some shift registers are improperly extended, and the display quality of the touch display panel is degraded. Thus, there is a need for a new shift register structure capable of solving this problem.

BRIEF SUMMARY OF THE INVENTION

A detailed description is given in the following embodiments with reference to the accompanying drawings.

The present invention provides an embodiment of an image display system. The image display system comprises a touch display panel, comprising a pixel matrix with a plurality of pixels; and a gate driving circuit, arranged to generate a plurality of gate driving signals to drive the pixels on the touch display panel according to a group of clock signals. The gate driving circuit comprises a plurality of shift registers, arranged to output the gate driving signals in sequence, wherein the plurality of shift registers are divided into groups arranged in sequence, and in adjacent $N^{th}$ and $N+1^{th}$ groups of shift registers of the groups, the driving signal from a first one of the $N+1^{th}$ group of shift registers is next to the driving signal from a last one of the $N^{th}$ group of shift registers; and at least one first compensation circuit, disposed between the adjacent $N^{th}$ and $N+1^{th}$ groups of shift registers, and connected to the last one of the $N^{th}$ group of shift registers and the first one of the $N+1^{th}$ group of shift registers. The first compensation circuit provides a first control signal to enable the last one of the $N^{th}$ group of shift registers to perform signal holding, and provides a second control signal to enable the first one of the $N+1^{th}$ group of shift registers to perform pre-charging, wherein N is an integer greater than zero.

The present invention also provides an embodiment of a gate driving circuit generating a plurality of gate driving signals to drive the pixels on a touch display panel according to a group of clock signals. The gate driving circuit comprises a plurality of shift registers and at least one first compensation circuit. The plurality of shift registers are arranged to output the gate driving signals in sequence, the plurality of shift registers are divided into groups arranged in sequence, and in adjacent $N^{th}$ and $N+1^{th}$ groups of shift registers of the groups, the driving signal from a first one of the $N+1^{th}$ group of shift registers is next to the driving signal from a last one of the $N^{th}$ group of shift registers. The first compensation circuit is disposed between the adjacent $N^{th}$ and $N+1^{th}$ groups of shift registers, and connected to the last one of the $N^{th}$ group of shift registers and the first one of the $N^{th}$ group of shift registers. The first compensation circuit provides a first control signal to enable the last one of the $N^{th}$ group of shift registers to perform signal holding, and provides a second control signal to enable the first one of the $N+1^{th}$ group of shift registers to perform pre-charging, wherein N is an integer greater than zero.

The invention also provides another embodiment of a gate driving circuit disposed on a touch display panel, and the gate driving circuit comprises a $K^{th}$ shift register, disposed on a border of the touch display panel to output a $K^{th}$ gate driving signal; a $K+1^{th}$ shift register, disposed on the border to output a $K+1^{th}$ gate driving signal; and a first compensation circuit, disposed on the border to prevent a rising edge and/or a falling edge of the $K^{th}$ gate driving signal from the $K^{th}$ shift register and the $K+1^{th}$ gate driving signal from the $K+1^{th}$ shift register from being affected by a touch sensing period of the touch display panel. K is an integer greater than zero, the first compensation circuit comprises a first compensation subcircuit and a second compensation subcircuit, and the first and second compensation subcircuits are integrated into the $K^{th}$ shift register and the $K+1^{th}$ shift register respectively.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The description is made for the purpose of illustrating the general principles of the invention and should not be taken in a limiting sense. The scope of the invention is best determined by reference to the appended claims.

Figure 1A:
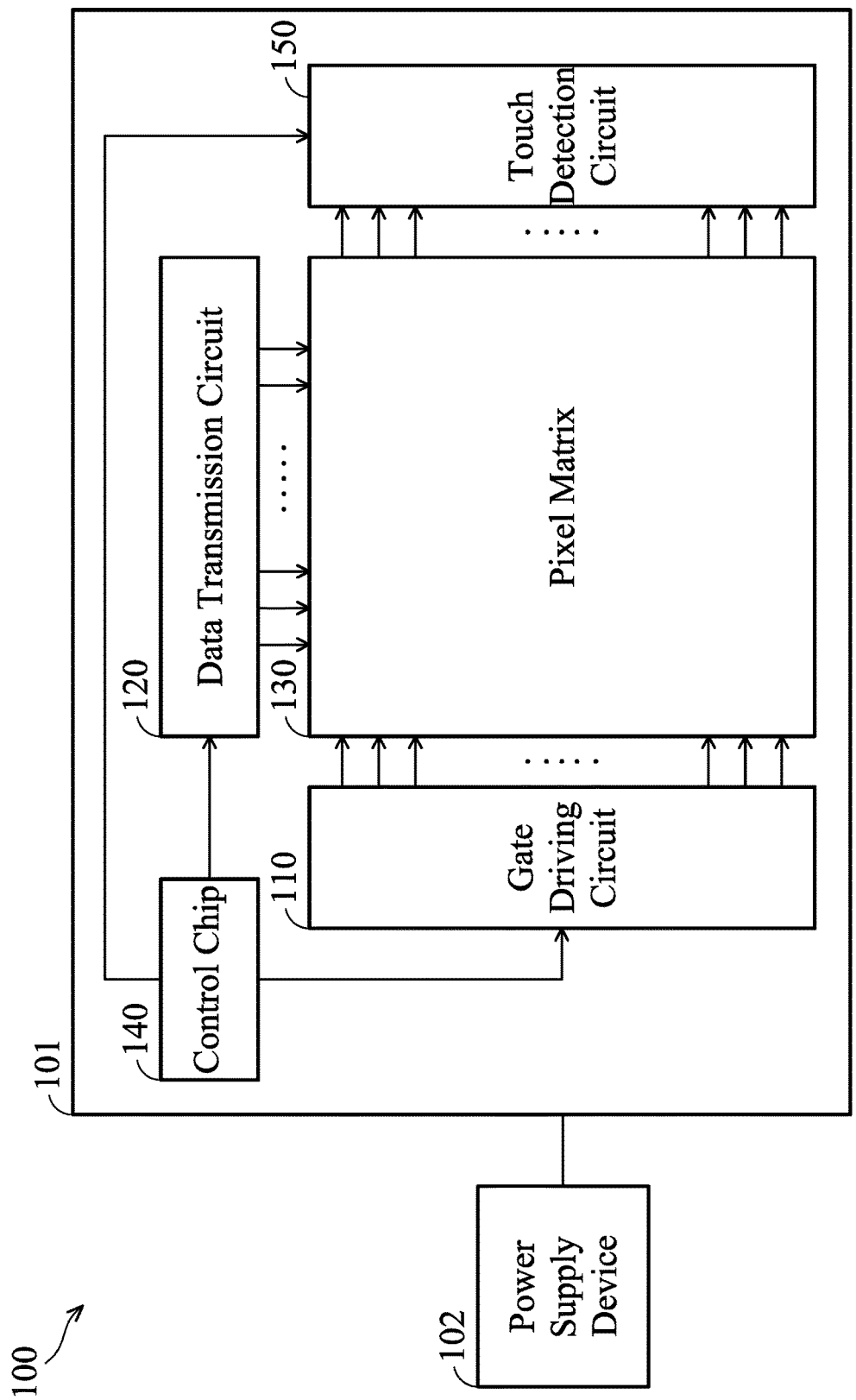
FIG. 1A is a diagram of an image display system according to the invention.

FIG. 1A shows an embodiment of an image display system of the present invention. As shown in FIG. 1A, the image display system comprises a touch display panel 101 to display images and sense the touch of an external object. In one embodiment, the touch display panel 101 is an in-cell touch display panel, but it is not limited thereto. For example, the touch display panel 101 can also be an on/out-cell touch display panel, or an in/on-cell touch display panel. The in/on-cell touch display panel comprises a gate driving circuit to perform touch sensing in one direction and a sensing electrode structure on a color filter substrate to perform touch sensing in another direction. The touch display panel 101 comprises a gate driving circuit 110, a data signal transmission circuit 120, a pixel matrix 130, a control chip 140 and a touch detection circuit 150. The data signal transmission circuit 120, the control chip 140 and the touch detection circuit 150 can be separate chips or can be integrated into a single chip, but it is not limited thereto. In some embodiments, only the data signal transmission circuit 120 and the touch detection circuit 150 are integrated into a single chip.

The gate driving circuit 110 is arranged to generate a plurality of gate driving signals to drive a plurality of pixels of the pixel matrix 130. The data signal transmission circuit 120 is arranged to generate a plurality of data signals to provide data to the pixels of the pixel matrix 130. For example, the pixel matrix 130 comprises a plurality of gate lines, a plurality of data lines and a plurality of pixels. In some embodiments, the pixels of the pixel matrix 130 and a plurality of sensing electrodes for touch sensing are integrated together, so that the touch display panel 101 can display images and sense the touch of the external object. The control chip 140 is arranged to generate a plurality of control signals comprising clock signals and a start pulse. The touch detection circuit 150 generates a touch position data according voltages or charge variation on the sensing electrodes and outputs the touch position data to an external processor for subsequent processing. For example, the sensing electrodes senses capacitance variation when the touch display panel is touched by a stylus or a finger, converts the sensed capacitance variation into voltages, and then the touch detection circuit 150 detects such variation. In one embodiment, the pixel matrix 130 is disposed on a substrate, and the gate driving circuit 110 is fabricated on the substrate by amorphous silicon TFT gate driver circuit (ASG) technology to form a gate driver on panel (GOP).

Furthermore, the image display system of the present invention can be included in an electronic device 100. The electronic device 100 comprises the touch display panel 101 and a power supply device 102 arranged to power the touch display panel 101. In some embodiments, the electronic device 100 can be a mobile phone, a digital camera, a personal digital assistant (PDA), a mobile computer, a desktop computer, a television, a car display, a mobile disk player, or any device capable of displaying images. According to embodiments of the invention, the gate driving circuit 110 can output gate driving signals to the gate lines in sequence with different scanning sequences (e.g., a forward scan sequence and a reverse scan sequence) so that the video signals on the data lines can be written to the pixels of the pixel matrix 130 in sequence.

Figure 1B:
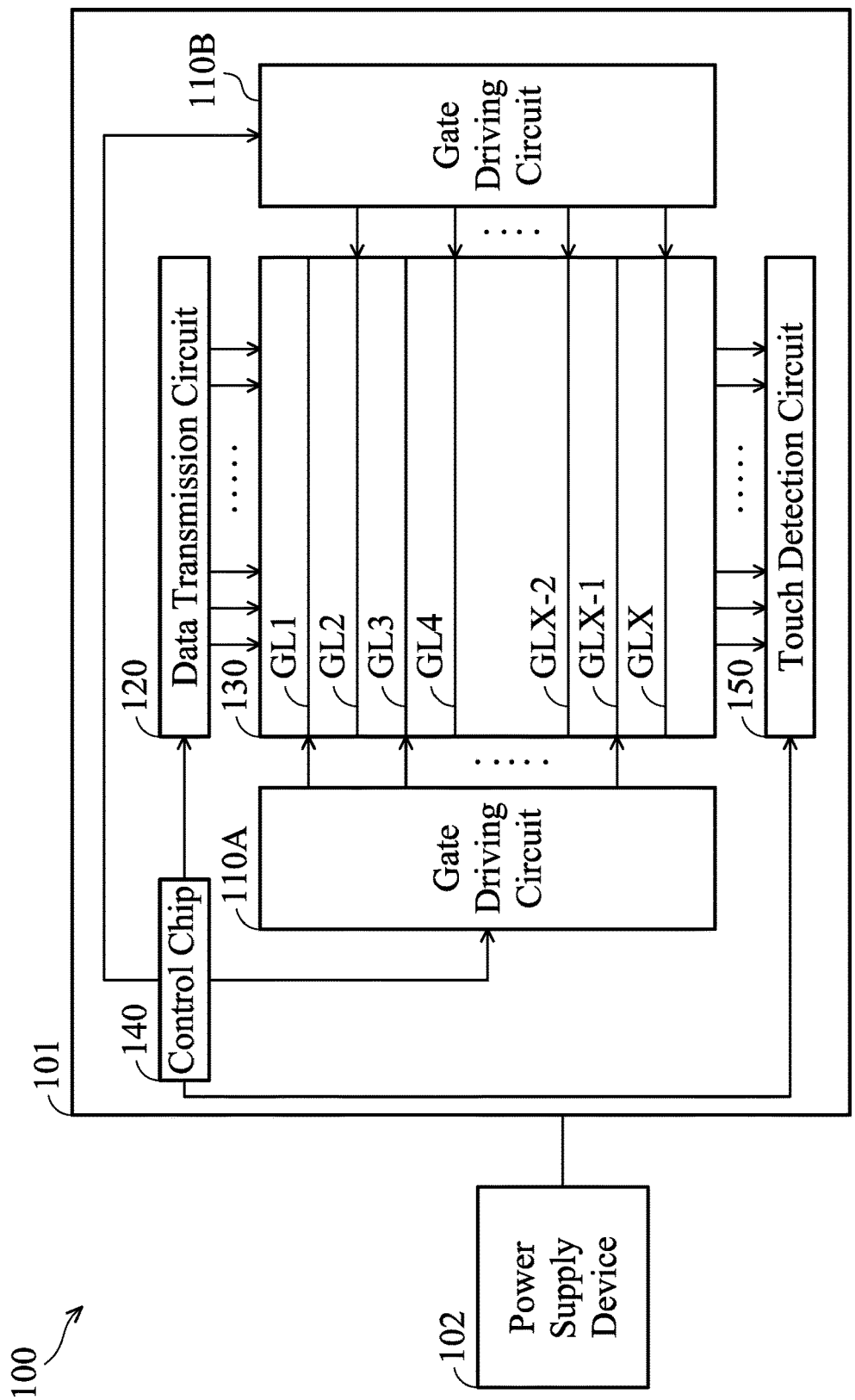
FIG. 1B is another diagram of an image display system according to the invention.

FIG. 1B shows another embodiment of the image display system of the present invention. As shown, the image display system comprises gate driving circuits 110A and 110B. The gate driving circuit 110A is arranged to drive odd-numbered gate lines, such as GL1, GL3, . . . , GLX−1, and the gate driving circuit 110B is arranged to drive even-numbered gate lines, such as GL2, GL4, . . . , GLX. The gate driving circuits 110A and 110B are disposed on different sides of the touch display panel 101, and it is beneficial to border symmetry. Specifically, the gate driving circuit is divided into two portions and disposed on opposite sides of the active area (i.e., display area) to output odd-numbered driving signals and even-numbered driving signals. This design can avoid overcrowding on the non-display area because the gate driving circuits are disposed on one side. Thus, the touch display panel can have a narrow border, a uniform routing area, and identical border areas on opposite sides.

Figure 1C:
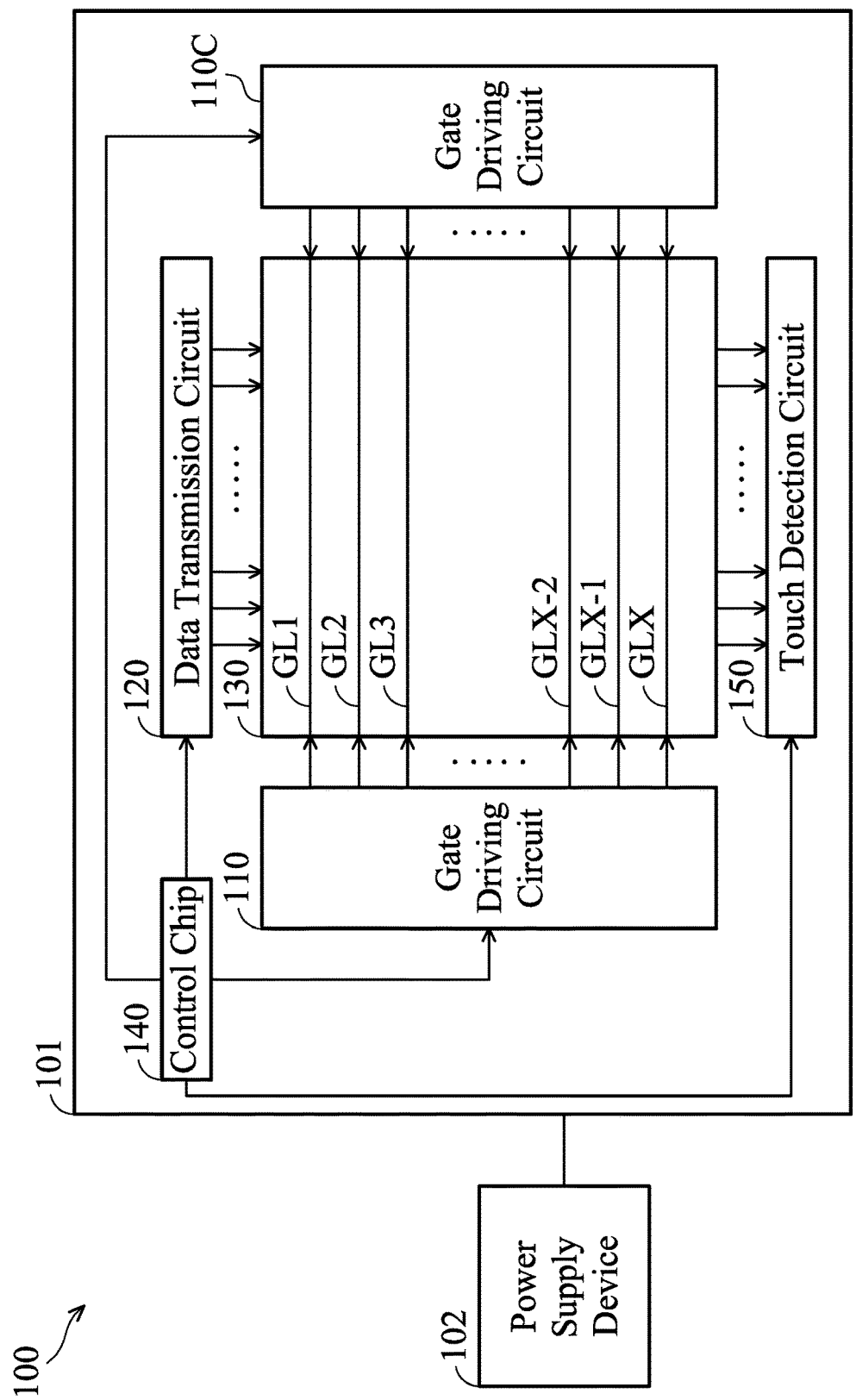
FIG. 1C is another diagram of an image display system according to the invention.

FIG. 1C shows another embodiment of the image display system of the present invention. As shown, the image display system comprises gate driving circuits 110 and 110C disposed on opposite sides of the active area. Each gate line of the pixel matrix 130 is driven by one shift register in the gate driving circuit 110 and one shift register in the gate driving circuit 110C together so that the gate driving circuits 110 and 110C can be operated under a heavy load. For example, in large-size panels (larger than 17 inch), the loading (i.e., resistance-capacitance loading) of each gate line is heavy because of greater length. Thus, the gate line GL1 is driven by shift registers SR1 in both gate driving circuits 110 and 110C, and so on.

Figure 2:
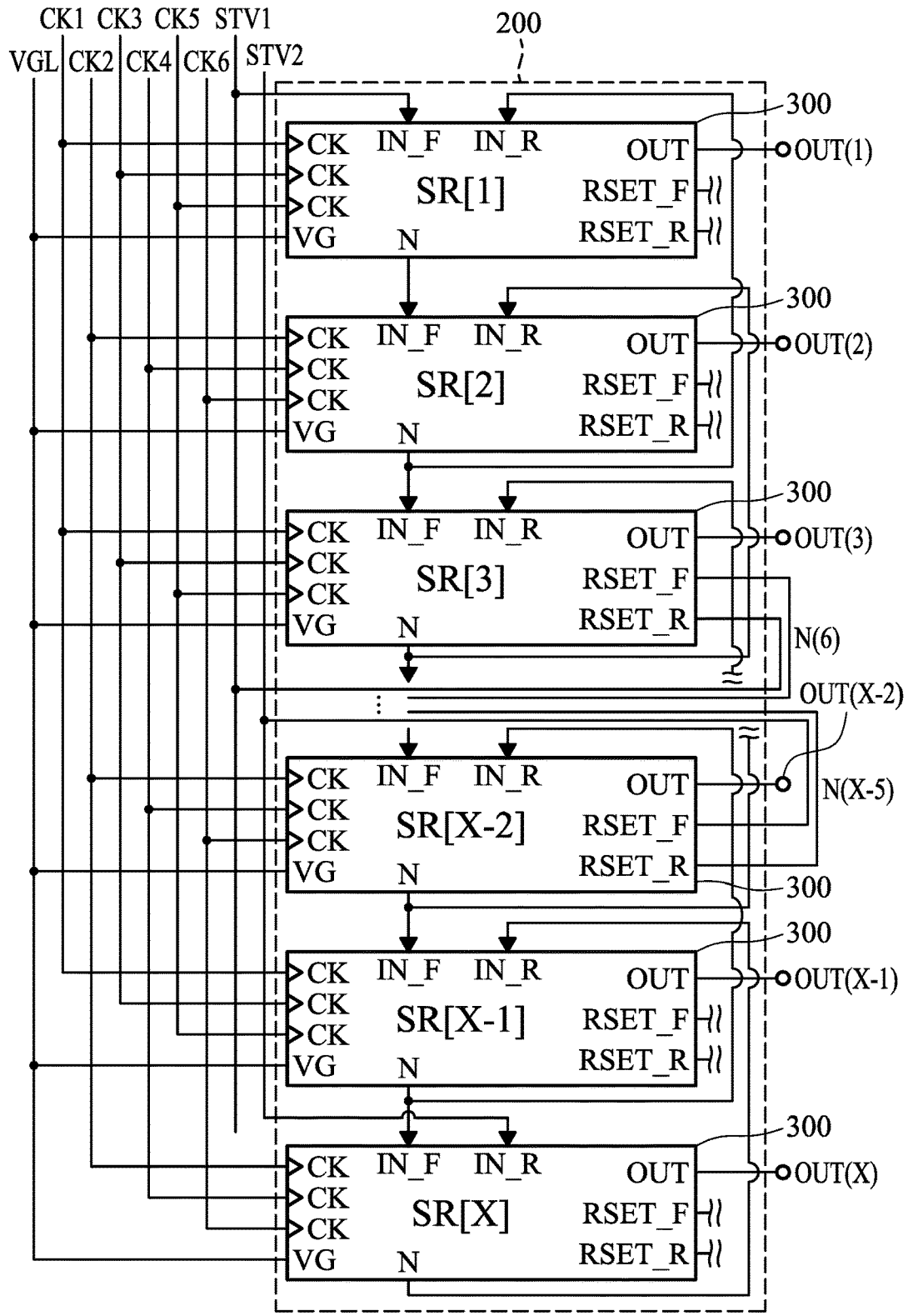
FIG. 2 is a diagram of a gate driving circuit shown in FIG. 1A according to the invention.

FIG. 2 is a diagram of the gate driving circuit 110A shown in FIG. 1A of the present invention. The gate driving circuit 110A comprises X shift registers 300 connected in series, i.e., shift registers SR[1], SR[2], SR[3], . . . , SR[X−2], SR[X−1] and SR[X], wherein X is an positive integer. Each shift register comprises a plurality of clock input terminals CK, a voltage input terminal VG, a forward input terminal IN_F, a reverse input terminal IN_R, an output terminal OUT, a signal transmission terminal N, and a forward reset input terminal REST_F and a reverse reset input terminal REST_R. The signal transmission terminal N and the output terminal OUT of each shift register output the same driving signal, so that the pulses of the driving signals are delivered between the shift registers in sequence.

When the gate driving circuit 110A is operated in forward scan, the shift registers 300 output driving signals in a first sequence. For example, shift registers SR[1] to SR[X] output driving signals OUT(1), OUT(2), OUT(3), . . . , OUT(X−2), OUT(X−1) and OUT(X) in sequence. Conversely, when the gate driving circuit 110A is operated in reverse scan, OUT(X), OUT(X−1), OUT(X−2), OUT(3), OUT(2) and OUT(1) are output in sequence.

The gate driving circuit 110 receives a plurality of control signals comprising clock signals CK1, CK2, CK3, CK4, CK5 and CK6, start pulses STV1 and STV2, and a constant voltage VGL, from the control chip 140. Generally, in the clock signals CK1 to CK6, two sequential clock signals have an overlapped half pulse. For example, as shown in the timing diagram of FIG. 4, the former half pulse of the clock signal CK2 is overlapped with the latter half pulse of the clock signal CK1, and the former half pulse of the clock signal CK3 is overlapped with the latter half pulse of the clock signal CK2. The clock signals CK1, CK3 and CK5 are provided to odd-numbered/even-numbered shift registers and the clock signals CK2, CK4 and CK6 are provided to even-numbered/odd-numbered shift registers.

The start pulses STV1 and STV2 are arranged to enable the gate driving circuit 110. As shown, the first shift register SR[1] of the gate driving circuit 110A receives the start pulse STV1 at its forward input terminal IN_F to serve as a forward input signal, and the last shift register SR[X] of the gate driving circuit 110A receives the start pulse STV2 at its reverse input terminal IN_R to serve as a reverse input signal. In addition, each shift register receives the driving signal from the previous shift register at its forward input terminal IN_F to serve as a forward input signal and receives the driving signal from the next shift register at its reverse input terminal IN_R to serve as a reverse input signal.

In one embodiment of the present invention, the $N^{th}$ shift register receives the driving signal from the $N+2^{th}$ shift register or the $N+3^{th}$ shift register at its forward reset input terminal REST_F to serve as a forward reset signal and receives the driving signal from the $N-2^{th}$ shift register or the $N-3^{th}$ shift register at its reverse reset input terminal REST_R to serve as a reverse reset signal. In another embodiment of the present invention, the $N^{th}$ shift register receives the driving signal from the $N+A^{th}$ shift register at its forward reset input terminal REST_F to serve as a forward reset signal and receives the driving signal from the $N-A^{th}$ shift register at its reverse reset input terminal REST_R to serve as a reverse reset signal, wherein A is equal to 1 or larger than 1. In addition, the coupling method of the forward and reverse reset signals of first several shift registers and last several shift registers in the gate driving circuit have a special design, thereby avoiding timing errors.

For example, as shown in FIG. 2, the reverse reset input terminals REST_R of the shift registers SR[1], SR[2] and SR[3] are connected to the start pulse STV1, and the forward reset input terminals REST_F of the shift registers SR[1], SR[2] and SR[3] are respectively connected to the signal transmission terminals N[4], N[5] and N[6] of the shift registers SR[4], SR[5] and SR[6]. The forward reset input terminals REST_F of the shift registers SR[X−2], SR[X−1] and SR[X] are connected to the start pulse STV2, and the reverse reset input terminals REST_R of the shift registers SR[X−2], SR[X−1] and SR[X] are respectively connected to the signal transmission terminals N[X−5], N[X−4] and N[X−3] of the shift registers SR[X−5], SR[X−4] and SR[X−3]. Each of the shift registers SR[4] to SR[X−3] other than the shift registers SR[1], SR[2], SR[3], SR[X−2], SR[X−1] and SR[X] receives the driving signal from one of the following shift registers at its forward reset input terminal to serve as a forward reset signal, and receives the driving signal form one of the previous shift registers at it reverse reset input terminal to serve as a reverse reset signal. For example, the forward reset input terminal REST_F and the reverse reset input terminal REST_R of the shift register SR[4] are respectively connected to the signal transmission terminals of the shift register SR[7] and the shift register SR[1], the forward reset input terminal REST_F and the reverse reset input terminal REST_R of the shift register SR[5] are respectively connected to the signal transmission terminals of the shift register SR[8] and the shift register SR[2], and so on.

Figure 3:
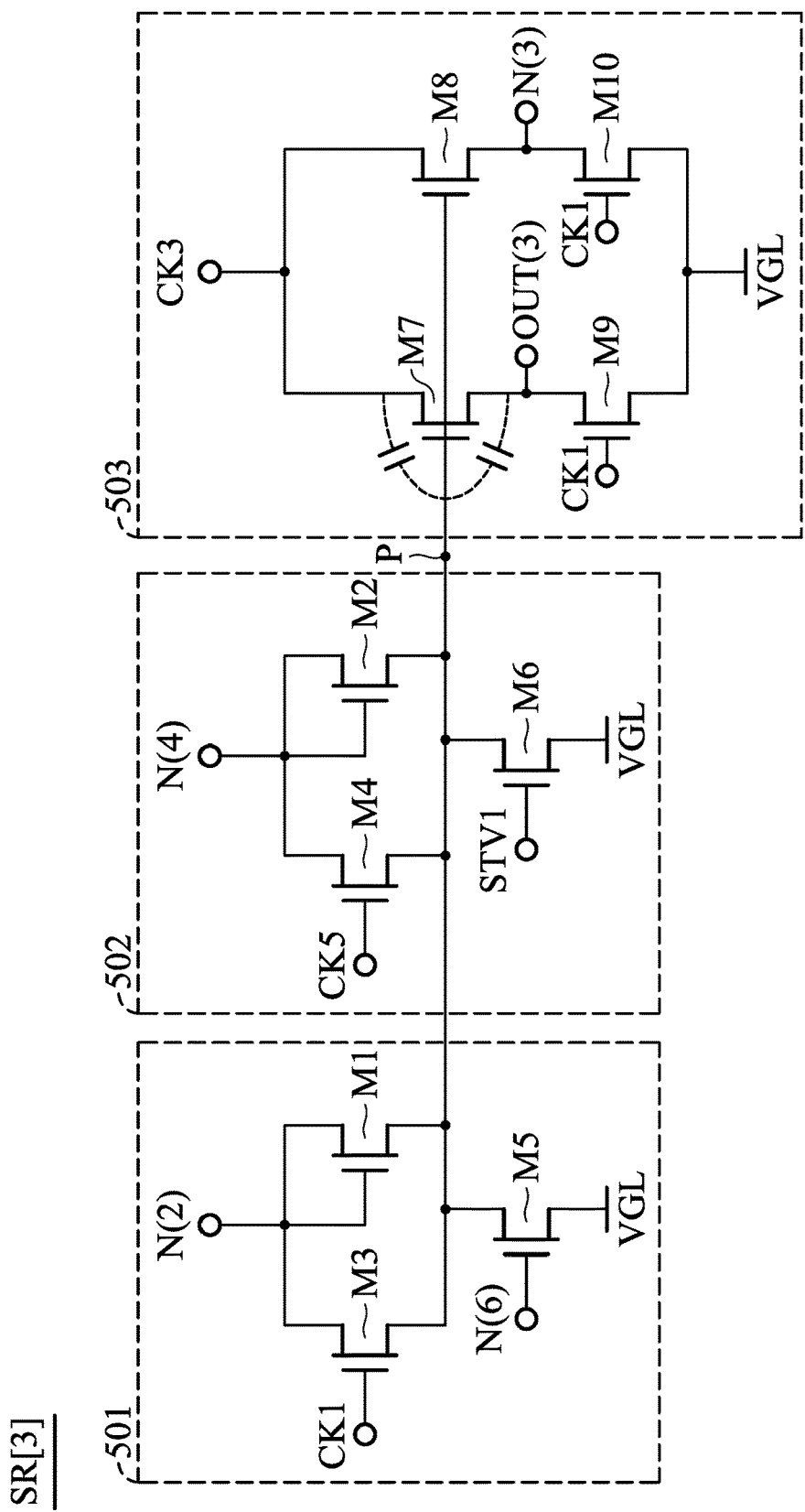
FIG. 3 shows an embodiment of a shift register according to the invention.
Figure 4:
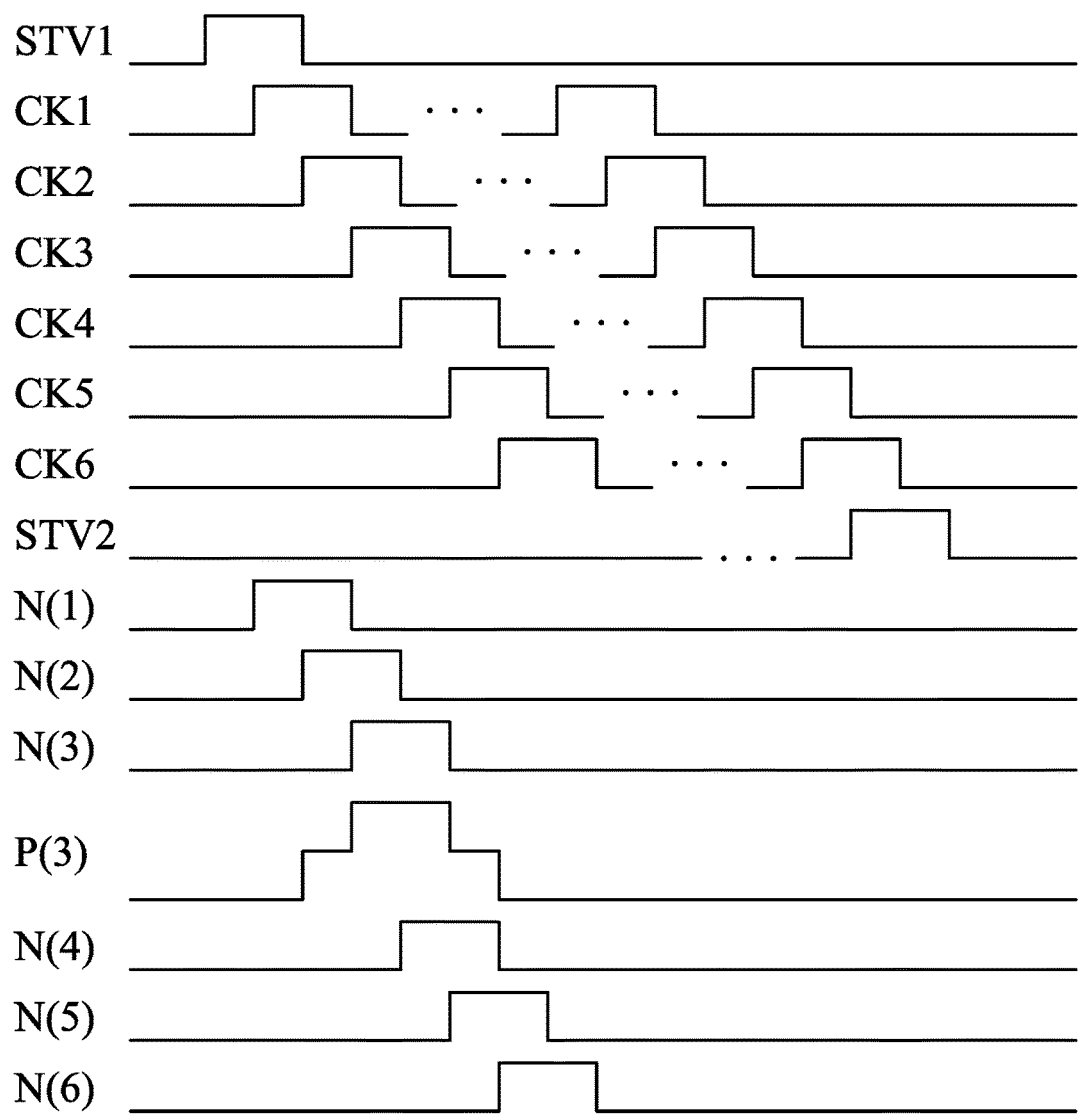
FIG. 4 is a timing diagram of the shift register shown in FIG. 3 during a forward scan.

FIG. 3 is a circuit diagram of another embodiment of the shift register according to the invention. FIG. 4 is a timing diagram of the shift register shown in FIG. 3 when operating in the forward scan. In this embodiment, the shift register SR[3] is the $3^{rd}$ shift register in the gate driving circuit 110A comprising a forward input circuit 501, a reverse input circuit 502 and an output circuit 503. The shift register is implemented by NMOS transistors M1-M10. During the forward scan, the transistor M3 is turned on because of the pulse of the clock signal CK1, and the control node P is coupled to the forward input signal N(2). At this time, because the forward input signal N(2) is maintained at a low voltage level, the voltage at the control node P is maintained at a low voltage level. When the pulse of the forward input signal N(2) arrives, the transistor M1 is turned on to precharge the voltage at the control node P to a first high voltage level (i.e., signal P(3) shown in FIG. 4).

Because the control terminal is at a high voltage level, transistors M7 and M8 are turned on, and the pulse of the clock signal CK3 can be delivered to the output terminal OUT and the signal transmission terminal N. Thus, when the transistors M7 and M8 are being turned on, the driving signal OUT(3) and the signal N(3) have the same phase. In addition, when the pulse of the clock signal CK3 is at a high voltage level, the voltage at the control node P is further charged to a second high voltage level by the parasitic capacitor (or additional coupled capacitor) to increase the gate voltage of the transistors M7 and M8. A higher gate voltage is conducive to increasing the charging speed and the discharge speed of the output terminal OUT and the signal transmission terminal N.

When the pulse of the clock signal CK3 is terminated, the voltage at the control node P starts to discharge to the first high voltage level because the drain voltages of the transistors M7 and M8 are pulled to a low voltage level. Then, when the pulse of the forward reset signal N(6) arrives, the transistor M5 is turned on, and the control node P is coupled to the constant voltage VGL and is further discharged to a low voltage level.

As mentioned above, when operating in the forward scan, the forward input circuit acts as a primary circuit to control the voltage at the control node P and the reverse input circuit acts as an auxiliary circuit to assist the forward input circuit. Please refer to FIG. 5. The pulses of the signal N(4) and the clock signal CK5 respectively turn on the transistors M2 and M4 to assist the signal holding and discharging of the control node P.

Figure 5:
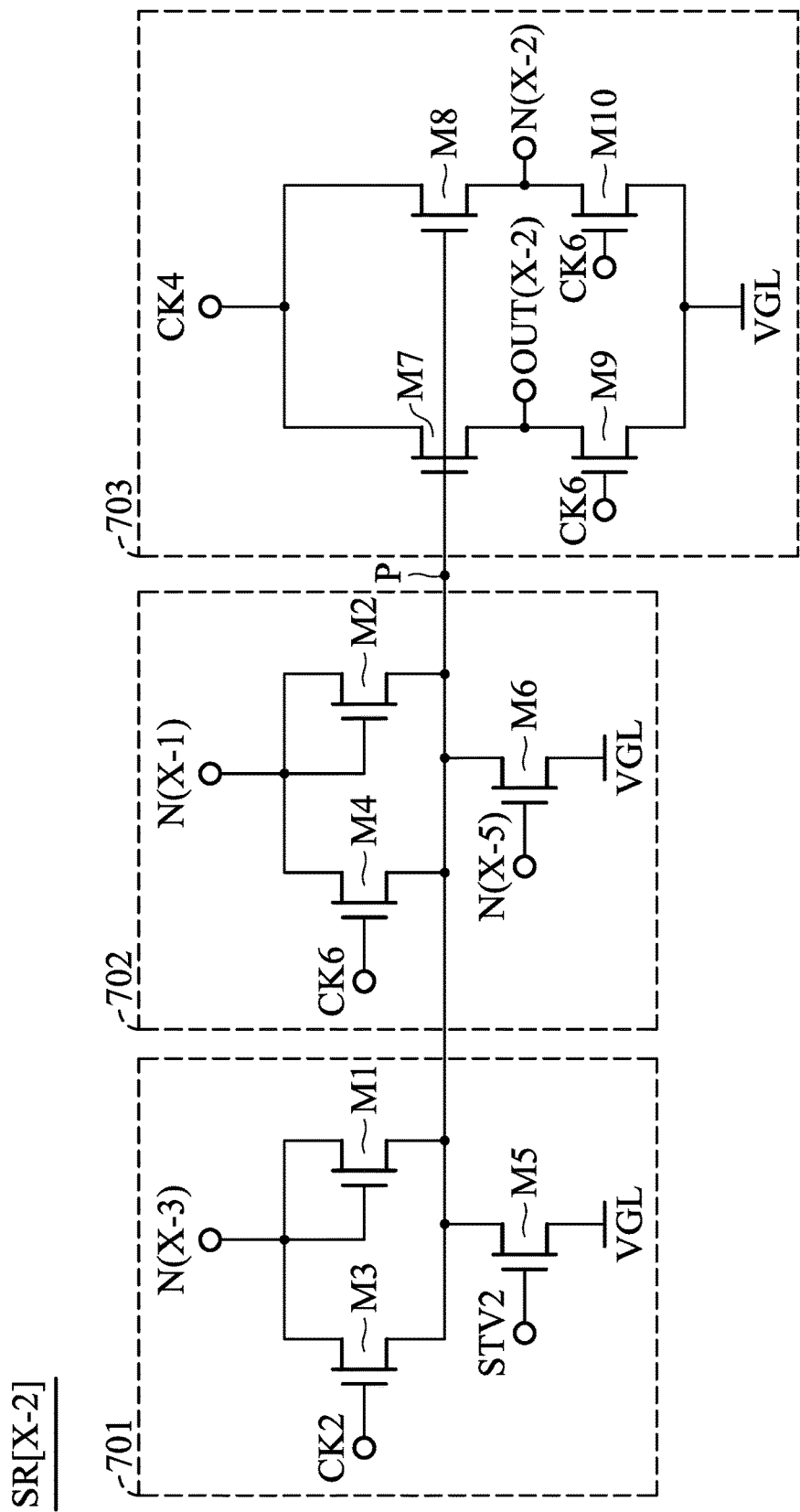
FIG. 5 shows another embodiment of a shift register according to the invention.
Figure 6:
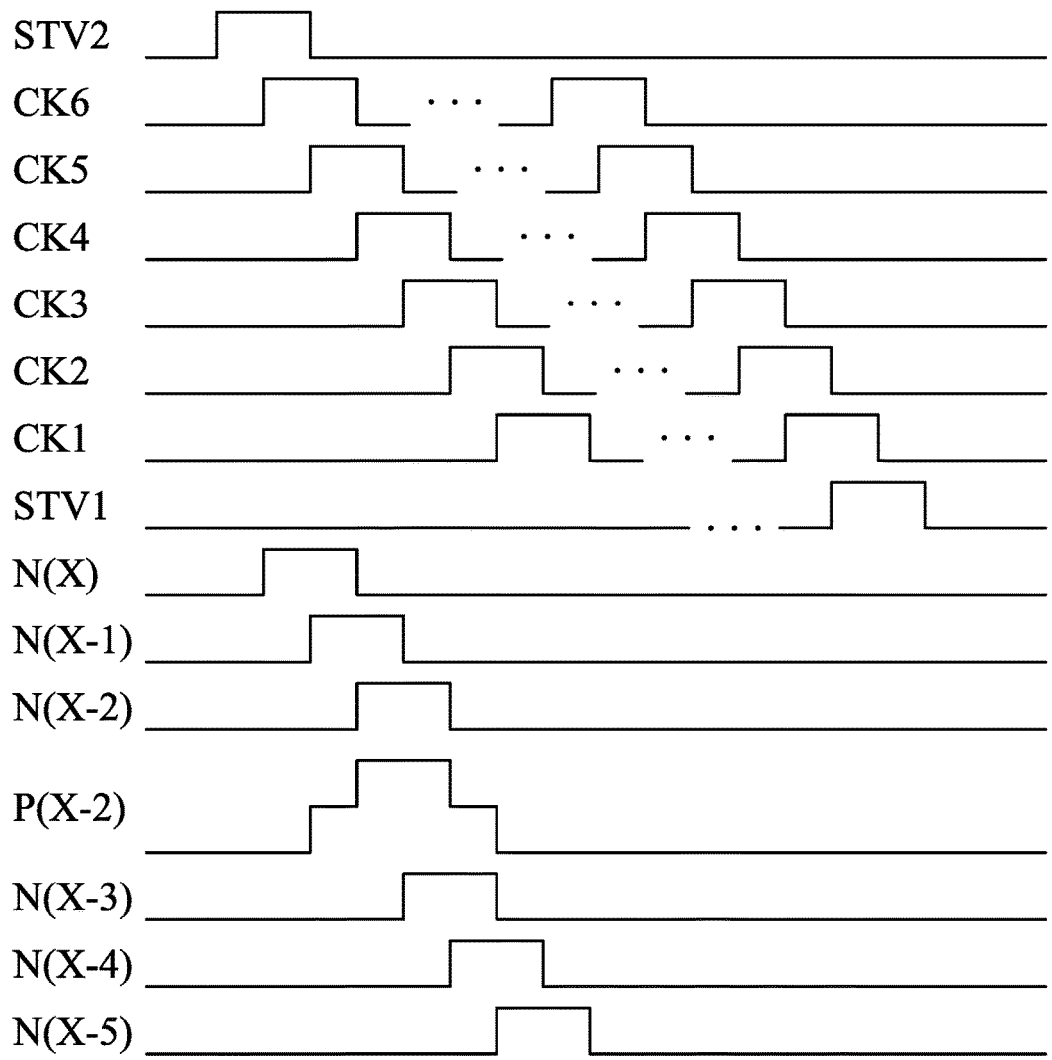
FIG. 6 is a timing diagram of the shift register shown in FIG. 5 during a reverse scan.

FIG. 5 is a circuit diagram of another embodiment of the shift register according to the invention. FIG. 6 is a timing diagram of the shift register shown in FIG. 5 when operating in the reverse scan. In this embodiment, the shift register SR[X−2] is the X−2$^{th}$ shift register in the gate driving circuit 110A comprising a forward input circuit 701, a reverse input circuit 702 and an output circuit 703. The shift register is implemented by NMOS transistors M1-M10. During the reverse scan, the gate driving circuit 110A is enabled by the start pulse STV2, and the sequence of the clock signal CK1 to CK6 is reverse as shown in FIG. 6. The transistor M4 is turned on because of the pulse of the clock signal CK6, and the control node P is coupled to the reverse input signal N(X−1). At this time, because the reverse input signal N(X−1) is maintained at a low voltage level, the voltage at the control node P is maintained at a low voltage level. When the pulse of the reverse input signal N(X−1) arrives, the transistor M2 is turned on to pre-charge the voltage at the control node P to the first high voltage level (i.e., signal P(X−2) shown in FIG. 6).

Because the control terminal is at a high voltage level, transistors M7 and M8 are turned on, and the pulse of the clock signal CK4 can be delivered to the output terminal OUT and the signal transmission terminal N. Thus, when the transistors M7 and M8 are being turned on, the driving signal OUT(X−2) and the signal N(X−2) have the same phase. In addition, when the pulse of the clock signal CK4 is at a high voltage level, the voltage at the control node P is further charged to a second high voltage level by the parasitic capacitor (or an additional coupled capacitor) to increase the gate voltage of the transistors M7 and M8. A higher gate voltage is conducive to increasing the charging speed and the discharge speed of the output terminal OUT and the signal transmission terminal N.

When the pulse of the clock signal CK4 is terminated, the voltage at the control node P starts to discharge to the first high voltage level because the drain voltages of the transistors M7 and M8 are pulled to a low voltage level. Then, when the pulse of the forward reset signal N(X−5) arrives, the transistor M6 is turned on, so that the control node P is coupled to the constant voltage VGL and is further discharged to a low voltage level.

As mentioned above, when operating in the reverse scan, the reverse input circuit acts as a primary circuit to control the voltage at the control node P and the forward input circuit acts as an auxiliary circuit to assist the reverse input circuit. Please refer to FIG. 5. The pulses of the signal N(X−3) and the clock signal CK2 respectively turn on the transistors M1 and M3 to assist the signal holding of the control node P.

In addition, the gate driving circuit is implemented by the shift registers capable of operating in dual direction scans (i.e., forward scan and reverse scan) shown in FIGS. 2-6, the present invention is not limited thereto. In some embodiments, the gate driving circuit can also be implemented by the shift registers which can only be operated in a single direction (i.e., forward scan).

Figure 7:
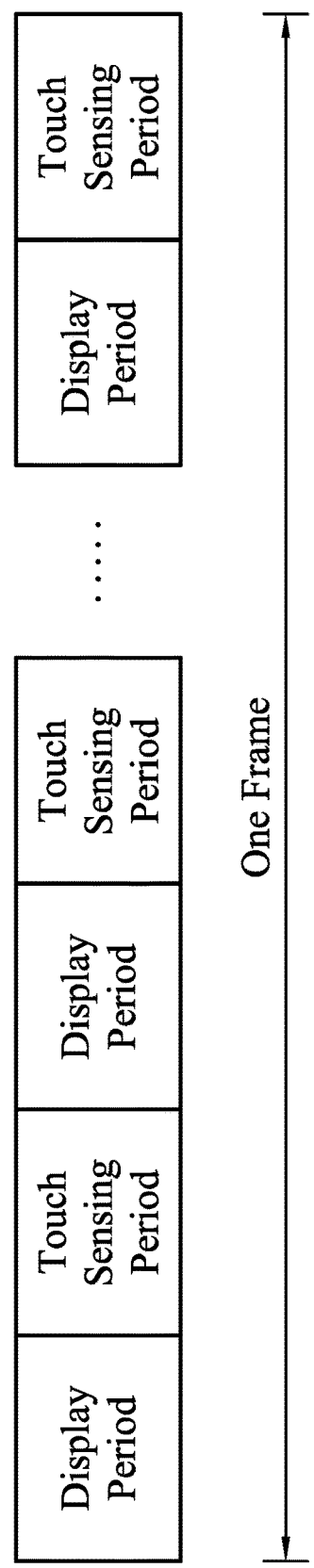
FIG. 7 shows a frame of the touch display panel according to the invention.

FIG. 7 is a diagram of a frame of the touch display panel according to the invention. According to some embodiments, the touch display panel can be an in-cell touch display panel, and each frame has a plurality of display periods and a plurality of touch sensing periods. As shown, the display periods and the touch sensing periods are arranged alternately. More specifically, the display periods and the touch sensing periods are periodically arranged in turn in one frame. For example, N shift registers operating in the display periods are divided into M groups of shift registers, and each group has the same amount of shift registers. In another embodiment, the display periods and the touch sensing periods are a periodically arranged in turn in one frame. For example, N shift registers operating in the display periods are divided into M groups of shift registers, and the M groups have different amounts of shift registers. In another embodiment, one frame has only one touch sensing period, and the display period is divided into two portions in this frame, and the touch sensing period is arranged between the two portions. Similarly, the amounts of the shift registers in the two portions of the display period can be the same or different. Please refer to FIG. 7 again. During each display period, one group of shift registers in the gate driving circuit 110 outputs a group of gate driving signals in sequence to drive a group of corresponding gate lines in the pixel matrix 103, and during each touch sensing period, the sensing electrodes perform touch sensing. In some embodiments, each touch sensing period is arranged between two display periods. In FIG. 7, the display periods and the touch sensing periods are both even. In some embodiments, one frame has even display periods and odd touch sensing periods or has odd display periods and even touch sensing periods, so that the last period of the frame is a display period to maintain the original display performance of the touch display panel.

Figure 8:
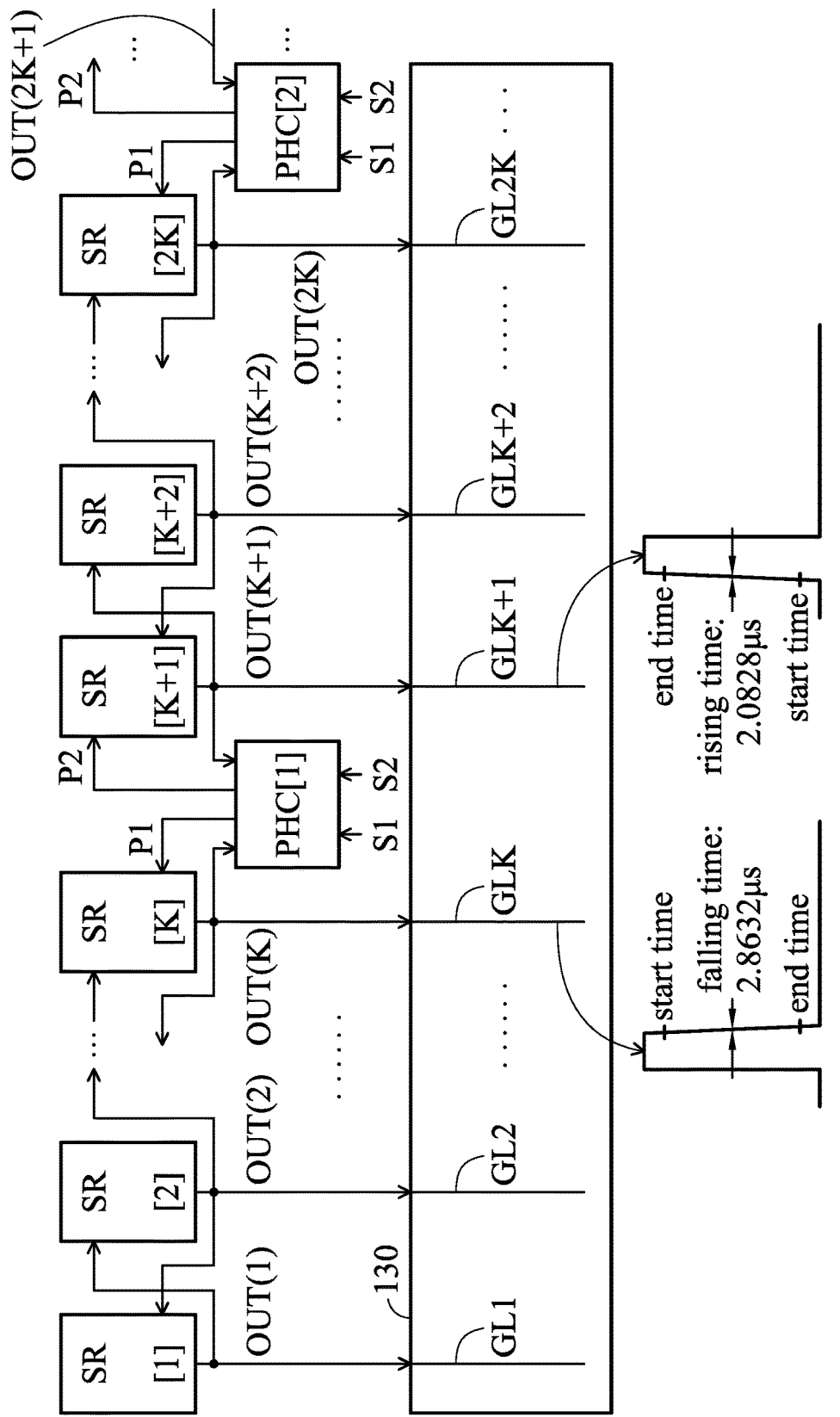
FIG. 8 shows another embodiment of the gate driving circuit according to the invention.

FIG. 8 is another diagram of the gate driving circuit according to the present invention. As shown, the gate driving circuit comprises a plurality of shift registers connected in sequence, such as SR[1], SR[2], SR[2K+1], and a plurality of compensation circuits, such as PHC[1], PHC[2]. K is an integer greater than zero, and for example, K is an integer greater than 3 in the embodiment shown in FIG. 8. The shift registers of the gate driving circuit is arranged to generate a plurality of gate driving signals in sequence according to clock signals CK1 to CK6, to drive a plurality of pixels of the pixel matrix 130. For example, the output terminal (i.e., the terminal for outputting OUT(1)) of the shift register SR[1] is connected to the gate line GL1, the output terminal of the shift register SR[2] is connected to the gate line GL2, and so on. The shift registers are divided into groups arranged in sequence. For example, the shift registers SR[1], SR[2], SR[K] form a first group of shift registers, the shift registers SR[K+1], SR[K+2], SR[2K] form a next group (i.e., a second group) of shift registers, and so on. The circuit connection in the shift registers of each group is the same as that shown in FIG. 2, and their circuit structure and operation are the same as that mentioned in FIG. 3 to FIG. 6, and thus are omitted for brevity. In some embodiments, the control chip 140 suspends or pauses the clocks signals provided to the gate driving circuit during touch sensing periods. For example, the suspended clock signal can be the clock signals CK1 to CK6 and/or the start pulses STV1 and STV2, but it is not limited thereto.

The compensation circuit PHC[1] is disposed between the last one SR[K] in the first group of shift registers and a first one SR[K+1] of the second group of shift registers, the compensation circuit PHC[2] is disposed between the last one SR[2K] in the second group of shift registers and a first one SR[2K+1] of the third group of shift registers, and so on. The compensation circuits disposed between two groups of shift registers in embodiments of the present invention are defined as first compensation circuits. However, the compensation circuit can also be disposed next to the last one of the all shift registers to provide a third control signal thereby enabling the last shift register to perform signal holding. Because this compensation circuit enables the last shift register to perform signal holding and does not enable the last shift register to perform pre-charging, this compensation circuit next to the last shift register is defined as a second compensation circuit. Each compensation circuit, such as PHC[1] or PHC[2], according to first and second control signals S1 and S2 other than the clock signals CK1 to CK6, enables one of the two connected shift registers to perform pre-charging and the other of them to perform signal holding, thereby preventing a rising edge and/or falling edge of the gate driving signals generated by the two connected shift registers from being affected by a touch sensing period of the touch display panel. For example, the compensation circuit PHC[1] enables one of the shift registers SR[K] and SR[K+1] to perform pre-charging and the other to perform signal holding, thereby preventing the rising edge and/or the falling edge of the gate driving signal of the shift registers SR[K] and SR[K+1] from being affected by the touch sensing period, and so on. Please refer to FIG. 12A defining the aforementioned signal holding and pre-charging. The signal holding means that the clock signal CK3 is overlapped with the first control signal S1, and if the touch sensing period begins after the clock signal CK4 is terminated, the first control signal S1 can be arranged to hold the output of the $35^{th}$ shift register (it is supposed that the $35^{th}$ shift register is the last one of the first group of shift registers) when clock signal CK4 is interrupted. The pre-charging means when the clock signal CK4 is overlapped with the second control signal S2, and the second control signal can be arranged to maintain the output of the $36^{th}$ shift register (it is supposed that the $36^{th}$ shift register is the first one of the second group of shift registers) when the clock signal CK4 is interrupted. Please refer to FIG. 8 again. FIG. 8 also shows an improved example of the falling edge and the rising edge when operating in the gate driving circuit in the present invention. The measured falling time (from 10% (i.e., start time) to 90% (i.e., end time) of the falling edge) of the output signal from the output shift register SR[K] is about 2.8632 us, and the measured rising time (from 10% (i.e., start time) to 90% (i.e., end time) of the rising edge) of the output signal from the output shift register SR[K+1] is about 2.0828 us. In view of this, there is no significant difference between the rising time and the falling time of the gate driving signals in the gate driving circuit of the present invention. For example, the difference between the falling time of the output shift registers SR[K] and SR[K−1] can be less than about 0.2 us, and the difference between the rising time of the output shift registers SR[K+1] and SR[K+2] can be less than about 0.2 us.

Figure 9:
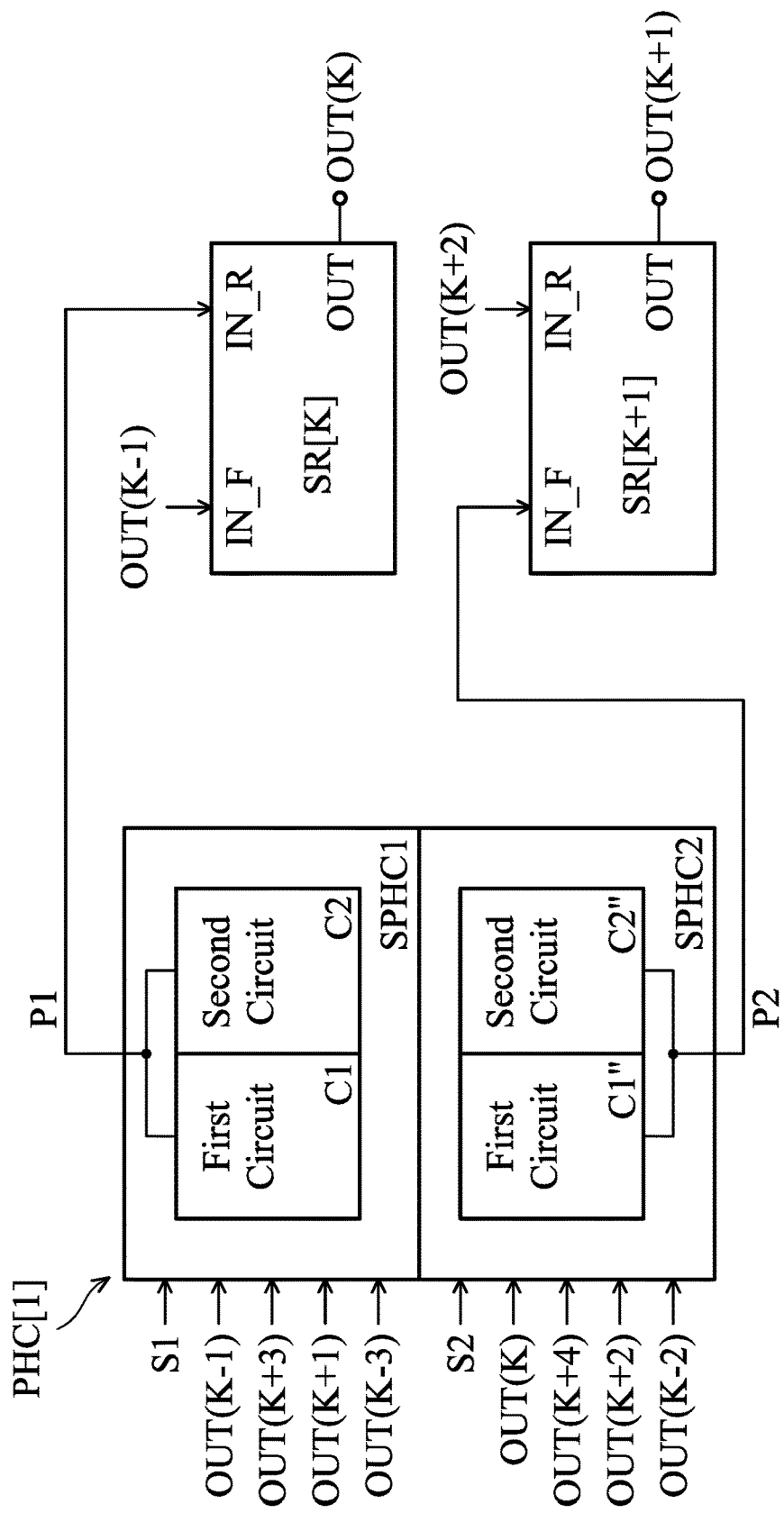
FIG. 9 is a diagram of the compensation circuit according to the invention.

Please refer to FIG. 8 and FIG. 9 at the same time. In this embodiment, the output terminal (i.e., the terminal outputting OUT(K)) and/or the transmission terminal N(K) (like the signal transmission terminal N(6)) of the shift register SR[K] are connected to the compensation circuit PHC[1] rather than the forward input terminal of the shift register SR[K+1], and the output terminal (i.e., the terminal outputting OUT(K+1)) and/or the transmission terminal N(K+1) of the shift register SR[K] are connected to the compensation circuit PHC[1] rather than the reverse input terminal of the shift register SR[K]. Namely, the driving signal OUT(K) of the shift register SR[K] is not output to the forward input terminal of the shift register SR[K+1] and the driving signal OUT(K+1) of the shift register SR[K+1] is not output to the reverse input terminal of the shift register SR[K]. Similarly, the output terminal of the shift register SR[2K] are connected to the compensation circuit PHC[2] rather than the forward input terminal of the shift register SR[2K+1], and the output terminal and/or the transmission terminal N(2K+1) of the shift register SR2[K+1] are connected to the compensation circuit PHC[2] rather than the reverse input terminal of the shift register SR[2K], and so on. Namely, the driving signal OUT(2K) of the shift register SR[2K] is not output to the forward input terminal of the shift register SR[2K+1] and the driving signal OUT(2K+1) of the shift register SR[2K+1] is not output to the reverse input terminal of the shift register SR[2K], and so on.

When the gate driving circuit is operated in a forward scan, the compensation circuit PHC[1], during a touch sensing period, outputs a first signal P1 to a reverse input signal of the shift register SR[K] according to the first control signal S1 to enable the shift register SR[K] to perform signal holding, and outputs a second signal P2 to the forward input terminal of the shift register SR[K+1] according to the second control signal S2 to enable the shift register SR[K+1] to perform pre-charging. When the gate driving circuit is operated in a reverse scan, the compensation circuit PHC[1], during a touch sensing period, outputs the second signal P2 to the forward input signal of the shift register SR[2K+1] according to the second control signal S2 to enable the shift register SR[2K+1] to perform signal holding, and outputs the first signal P1 to the reverse input terminal of the shift register SR[K] according to the first control signal S1 to enable the shift register SR[K] to perform pre-charging. Operations of other compensation circuits, such as PHC[2], are similar to that of the compensation circuit PHC[1], and thus, are omitted for brevity.

Please to FIG. 9 again. FIG. 9 is a diagram of the compensation circuit. As shown, the compensation circuit PHC[1] comprises a first compensation subcircuit SPHC1 and a second compensation subcircuit SPHC2, and each of the first compensation subcircuit SPHC1 and the second compensation subcircuit SPHC2 has a first circuit C1/C1" and a second circuit C2/C2". In some embodiments, the first compensation subcircuit SPHC1 and the second compensation subcircuit SPHC2 of the compensation circuit PHC[1] can be integrated into one or more shift register respectively. For example, the first compensation subcircuit SPHC1 can be integrated into the shift register SR[K] and the second compensation circuit SPHC2 can be integrated into the shift register SR[K+1], but it is limited thereto. In some embodiments, the first compensation subcircuit SPHC1 and the second compensation subcircuit SPHC2 can be integrated into one of the shift registers SR[K] and SR[K+1] together.

When the gate driving circuit is operated in the forward scan, during the touch sensing period, the first circuit C1 of the first compensation subcircuit SPHC1 outputs the first signal P1 according to the driving signal from the $W^{th}$ shift register and the first control signal S1 to enable the shift register SR[K] to perform signal holding, and the first circuit C1" of the second compensation subcircuit SPHC2 outputs the second signal P2 according to the driving signal from the $M^{th}$ shift register and the second control signal S2 to enable the shift register SR[K+1] to perform pre-charging. In some embodiments, W and M are integers, W is smaller than K and M is smaller than K+1. When the gate driving circuit is operated in the reverse scan, during the touch sensing period, the second circuit C2" of the second compensation subcircuit SPHC2 outputs the second signal P2 according to the driving signal from the $Y^{th}$ shift register and the second control signal S2 to enable the shift register SR[K+1] to perform signal holding, and the second circuit C2 of the first compensation subcircuit SPHC1 outputs the second signal P1 according to the driving signal from the $Z^{th}$ shift register and the first control signal S1 to enable the shift register SR[K] to perform pre-charging. In some embodiments, Y and Z are integers, Y is greater than K+1 and Z is greater than K. For example, in the embodiment shown in FIG. 11, W is K−1, M is K, Y is K+2 and Z is K+1, but it is not limited thereto. In the embodiment shown in FIG. 9, the first circuit C1 and the second circuit C2 of the first compensation subcircuit SPHC1 are reset according to the driving signals OUT(K+3) and OUT(K−3) from the shift registers SR[K+3] and SR[K−3] respectively. In addition, the first circuit C1" and the second circuit C2" of the second compensation subcircuit SPHC2 are reset according to the driving signals OUT(K+4) and OUT(K−4) from the shift registers SR[K+4] and SR[K−4] respectively.

Figure 10:
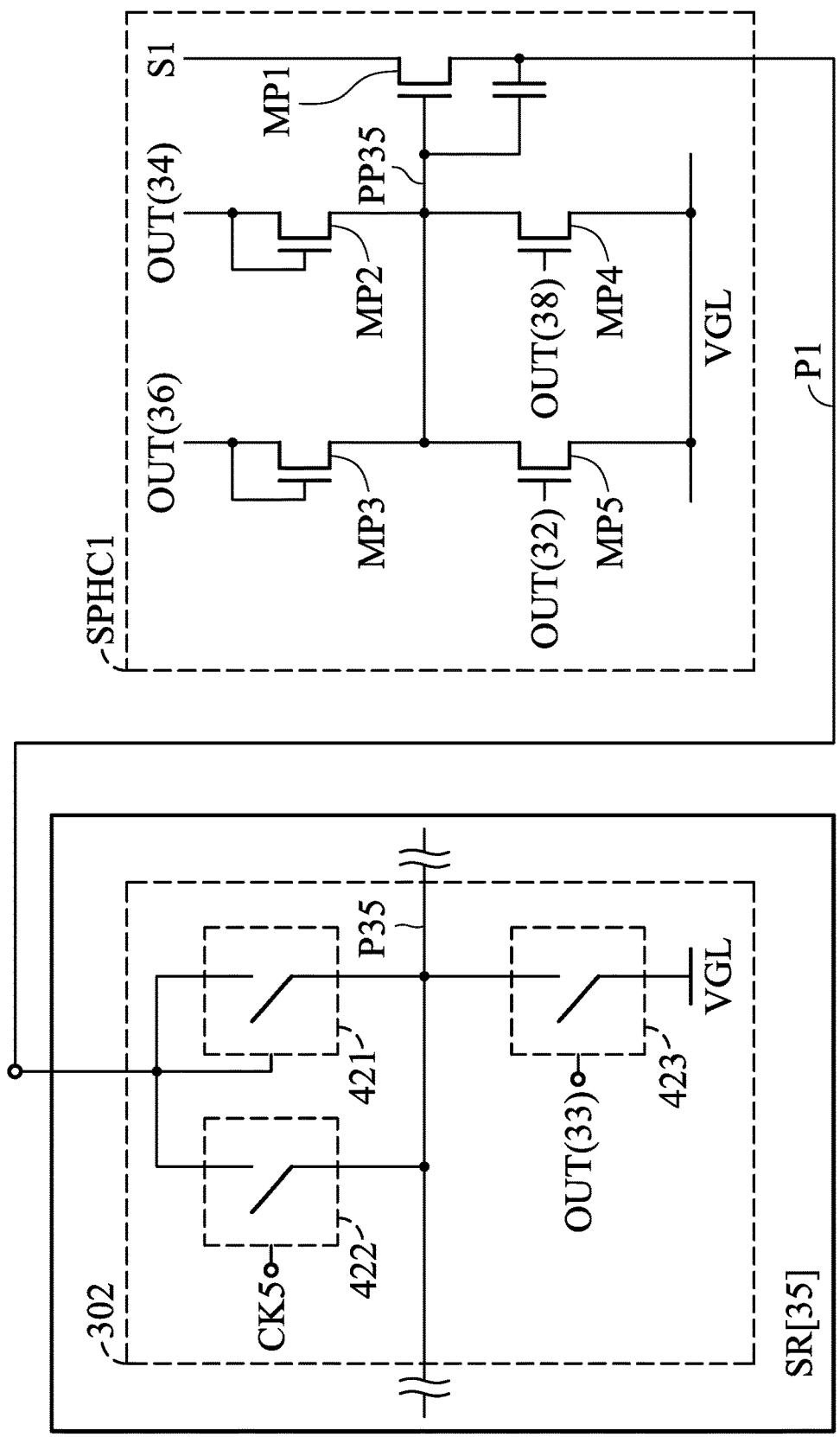
FIG. 10 shows an embodiment of a first compensation subcircuit according to the invention.

FIG. 10 shows an embodiment of the first compensation subcircuit SPHC1 (which is illustrated using the $35^{th}$ shift register). As shown, the first compensation subcircuit SPHC1 comprises transistors MP1 to MP5. The transistors MP1 to MP5 can be regarded as five switches and the switches can also be implemented by BJTs, diodes, and/or IGBTs. In the embodiment shown in FIG. 10, the first compensation subcircuit SPHC1 of the first compensation circuit PHC[1] is coupled to the reverse input terminal (i.e., the connection point of the switches 421 and 422 and corresponding to IN_R shown in FIG. 8) of the reverse input circuit 302 of the shift register SR[35]. The transistor MP1 has a first terminal coupled to the first control signal S1, a control terminal coupled to the control node PP35, and a second terminal outputting the first signal P1. The transistor MP2 has a first terminal and a control terminal which are coupled to the driving signal OUT(34) of the shift register SR[34], and a second terminal coupled to the control node PP35. The transistor MP3 has a first terminal and a control terminal which are coupled to the driving signal OUT(36) of the shift register SR[36] and a second terminal coupled to the control node PP35. The transistor MP4 has a first terminal and a control terminal which are coupled to the driving signal OUT(38) of the shift register SR[38] and a second terminal coupled to a constant voltage VGL. The transistor MP5 has a first terminal and a control terminal which are coupled to the driving signal OUT(32) of the shift register SR[32] and a second terminal coupled to the constant voltage VGL. The first circuit C1 is composed of the transistors MP1, MP2 and MP4, and the second C2 is composed of the transistors MP1, MP3 and MP5.

Figure 11:
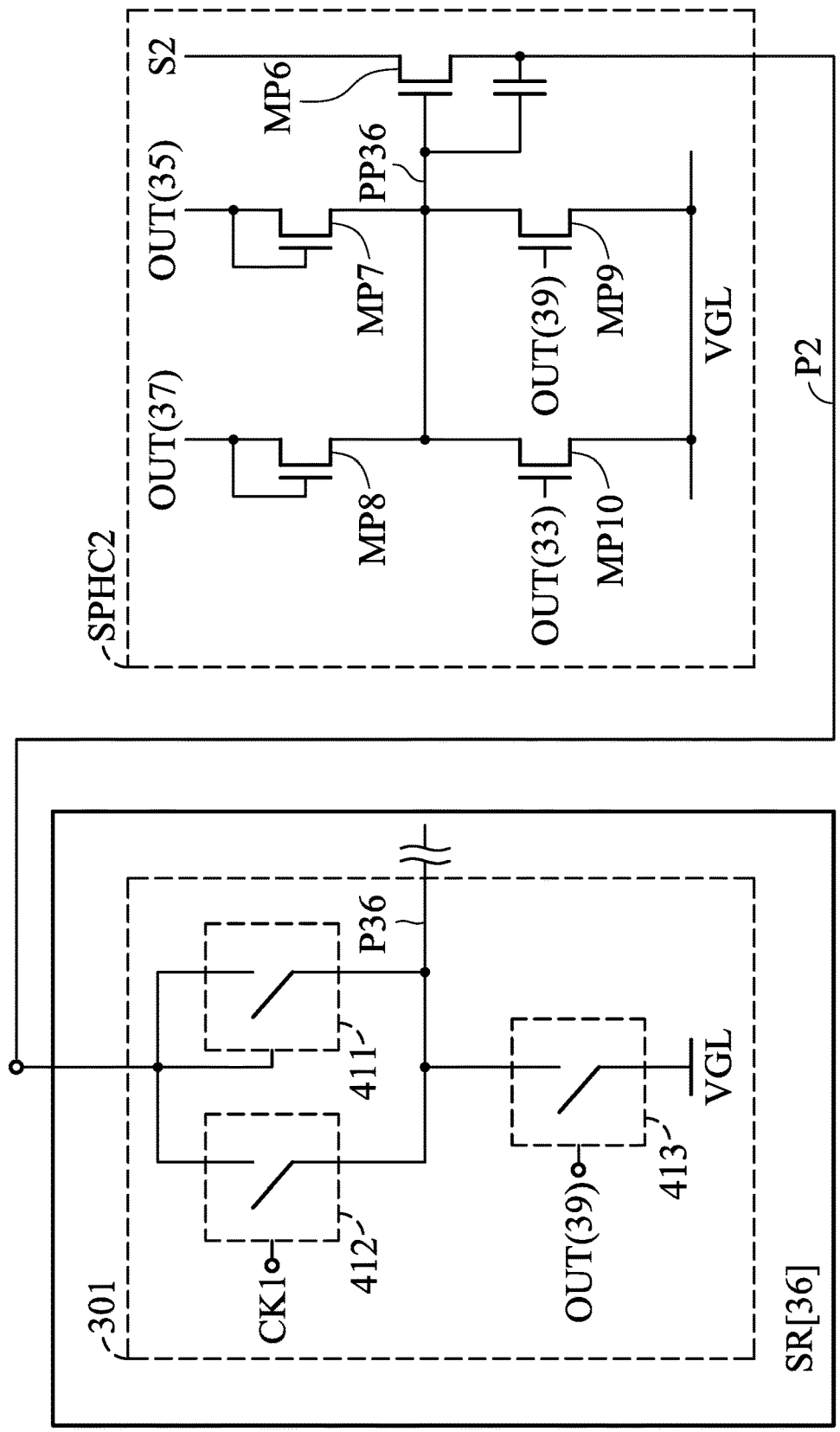
FIG. 11 shows an embodiment of a second compensation subcircuit according to the invention.

FIG. 11 shows an embodiment of the second compensation subcircuit SPHC2 (which is illustrated using the $36^{th}$ shift register). As shown, the second compensation subcircuit SPHC2 comprises transistors MP6 to MP10. The transistors MP6 to MP10 can be regarded as five switches and the switches can also be implemented by BJTs, diodes, and/or IGBTs. In the embodiment shown in FIG. 11, the second compensation subcircuit SPHC2 of the first compensation circuit PHC[1] is coupled to the forward input terminal (i.e., the connection point of the switches 412 and 411 and corresponding to IN_F shown in FIG. 8) of the forward input circuit 301 of the shift register SR[36]. The transistor MP6 has a first terminal coupled to the second control signal S2, a control terminal coupled to the control node PP36, and a second terminal outputting the second signal P2. The transistor MP7 has a first terminal and a control terminal which are coupled to the driving signal OUT(35) of the shift register SR[35], and a second terminal coupled to the control node PP36. The transistor MP8 has a first terminal and a control terminal which are coupled to the driving signal OUT(37) of the shift register SR[37] and a second terminal coupled to the control node PP36. The transistor MP9 has a first terminal and a control terminal which are coupled to the driving signal OUT(39) of the shift register SR[39] and a second terminal coupled to the constant voltage VGL. The transistor MP10 has a first terminal and a control terminal which are coupled to the driving signal OUT(33) of the shift register SR[33] and a second terminal coupled to the constant voltage VGL. The first circuit C1" is composed of the transistors MP6, MP7 and MP9, and the second C2" is composed of the transistors MP6, MP8 and MP10. As mentioned above, the signal transmission terminal N and the output terminal OUT of each shift register output the same driving signal, so that the pulses of the driving signals are delivered between the shift registers in sequence. Thus, the driving signals received by the compensation circuits PHC [1] and PHC[2] can be the driving signals from the signal transmission terminals or the output terminals of the shift registers.

Figure 12A:
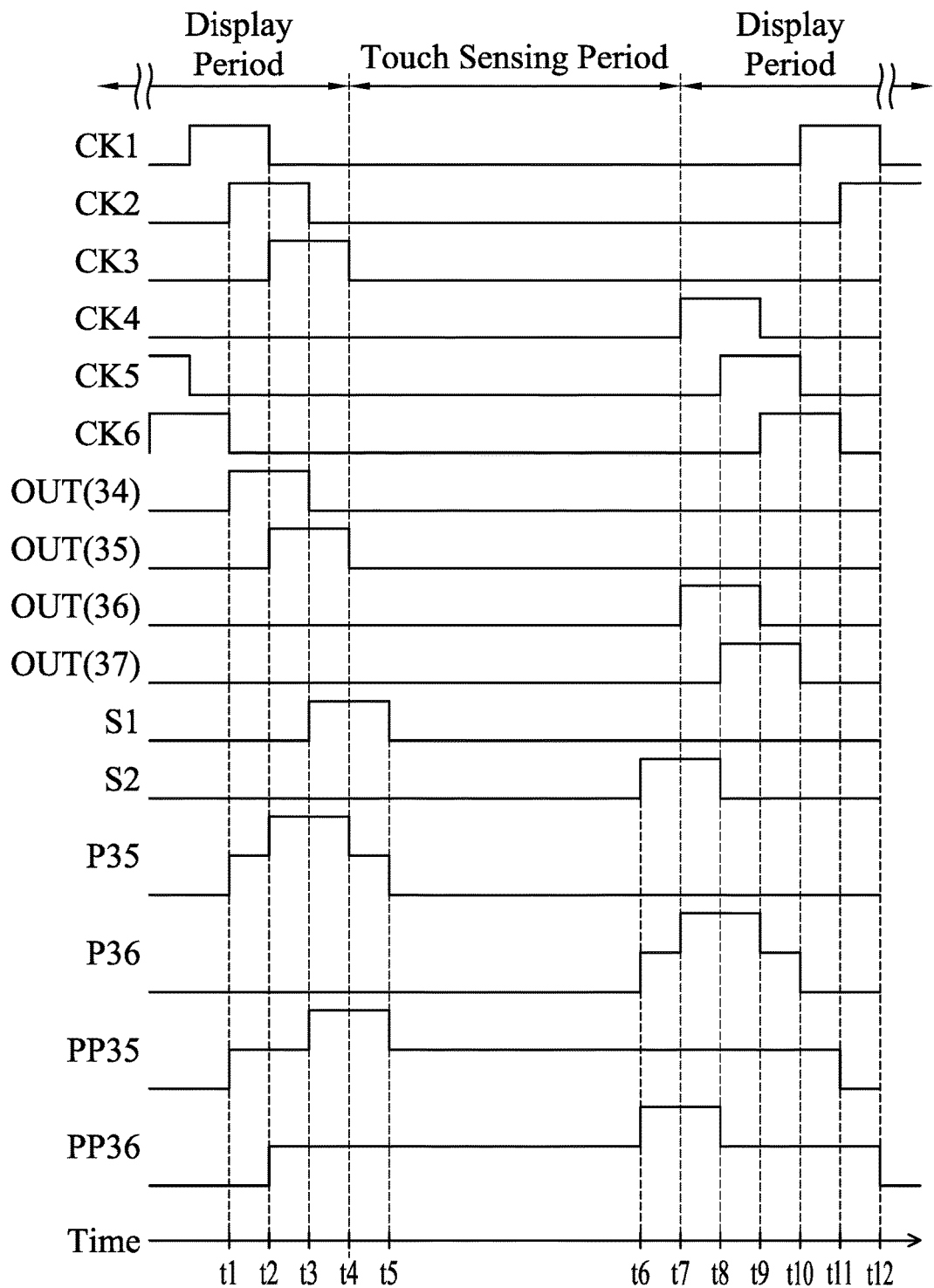
FIG. 12A is a timing diagram of the first compensation subcircuit shown in FIG. 10 and the second compensation subcircuit shown in FIG. 11.

FIG. 12A is a timing diagram of the first and second compensation subcircuits SPHC1 and SPHC2 shown in FIG. 10 and FIG. 11. During time t1 to t2, the transistor MP2 is turned on according to the driving signal OUT(34), so that the control node PP35 is pre-charged to a first high voltage. Similarly, the control node P35 of the shift register SR[35] is also pre-charged to the first high voltage level. During time t2 to t3, the shift register SR[35] outputs the driving signal OUT(35) according to the clock signal CK4 and the control node of the shift register SR[35] is charged to a second high voltage level. At this time, the transistor MP6 of the second compensation subcircuit SPHC2 is turned on according to the driving signal OUT(35), so that the control node PP35 is pre-charged to the first high voltage level. During time t3 to t4, the transistor MP1 outputs the first control signal S1 to the reverse input terminal IN_R of the shift register SR[35] to serve as the first signal P1, so that the switch 421 is turned on to perform signal holding. At this time, the control node PP35 of the shift register SR[35] is pulled to the second high voltage level from the first high voltage level because of the first control signal S1.

During time t4 to t7, the touch display panel 101 enters a touch sensing period, and thus, the control chip 104 suspends or pauses the clock signals CK1 to CK6. At this time, because the switch 421 of the shift register SR[35] is turned on, the control node PP35 is pulled low to the first high voltage level from the second high voltage level rather than the constant voltage VGL when the clock signal CK3 is at the low voltage level. Namely, during time t4 to t5, shift register SR[35] performs signal holding on the control node P35. During time t5 to t6, the first control signal changes to a low voltage level from the high voltage level, the control node PP35 is pulled low to the first high voltage level from the second high voltage level, and the control node P35 of the shift register SR[35] is pulled low to the constant voltage VGL from the first high voltage level (i.e., signal holding is finished). Please refer to FIG. 11 and FIG. 12A at the same time. Because the control node PP36 is pre-charged to the first high voltage level at time t2, the transistor MP6, during time t6 to t7, outputs the second control signal S2 to the forward input terminal of the shift register SR[36] to serve as the second signal P2, so that the switch 411 is turned on to perform pre-charging (i.e., the control node P36 of the shift register SR[36] is pre-charged to the first high voltage level).

At time t7, the touch display panel 101 finishes the touch sensing period and enters a next display period, and thus, the control chip 104 recovers the clock signals CK1 to CK6 (i.e., does not suspend the clock signals CK1 to CK6 and output the clock signal CK1 to CK6 again). During time t7 to t8, because the control node P36 of the shift register SR[36] is pre-charged to the first high voltage level, the shift register SR[36] can output the driving signal OUT(36) immediately when the clock signal CK4 is at the high voltage level. Furthermore, the control node P36 is also pulled high to the second high voltage level from the first high voltage level. During time t8 to t9, the second control signal S2 is at the low voltage level, the control node PP36 is pulled low to the first high voltage from the second high voltage level. During time t9 to t10, the control node P36 of the shift register SR[36] is pulled to the first high voltage level from the second high voltage level when the clock signal CK4 is at the low voltage level. Namely, in the touch sensing period, the first compensation subcircuit SPHC1 outputs the first signal P1 according to the first control signal S1 during time t4 to t5, to enable the shift register SR[35] to perform signal holding. The second compensation subcircuit SPHC2 outputs the second signal P2 to enable the shift register SR[36] to perform pre-charging according to the second control signal S2, during time t6 to t7.

Figure 12B:
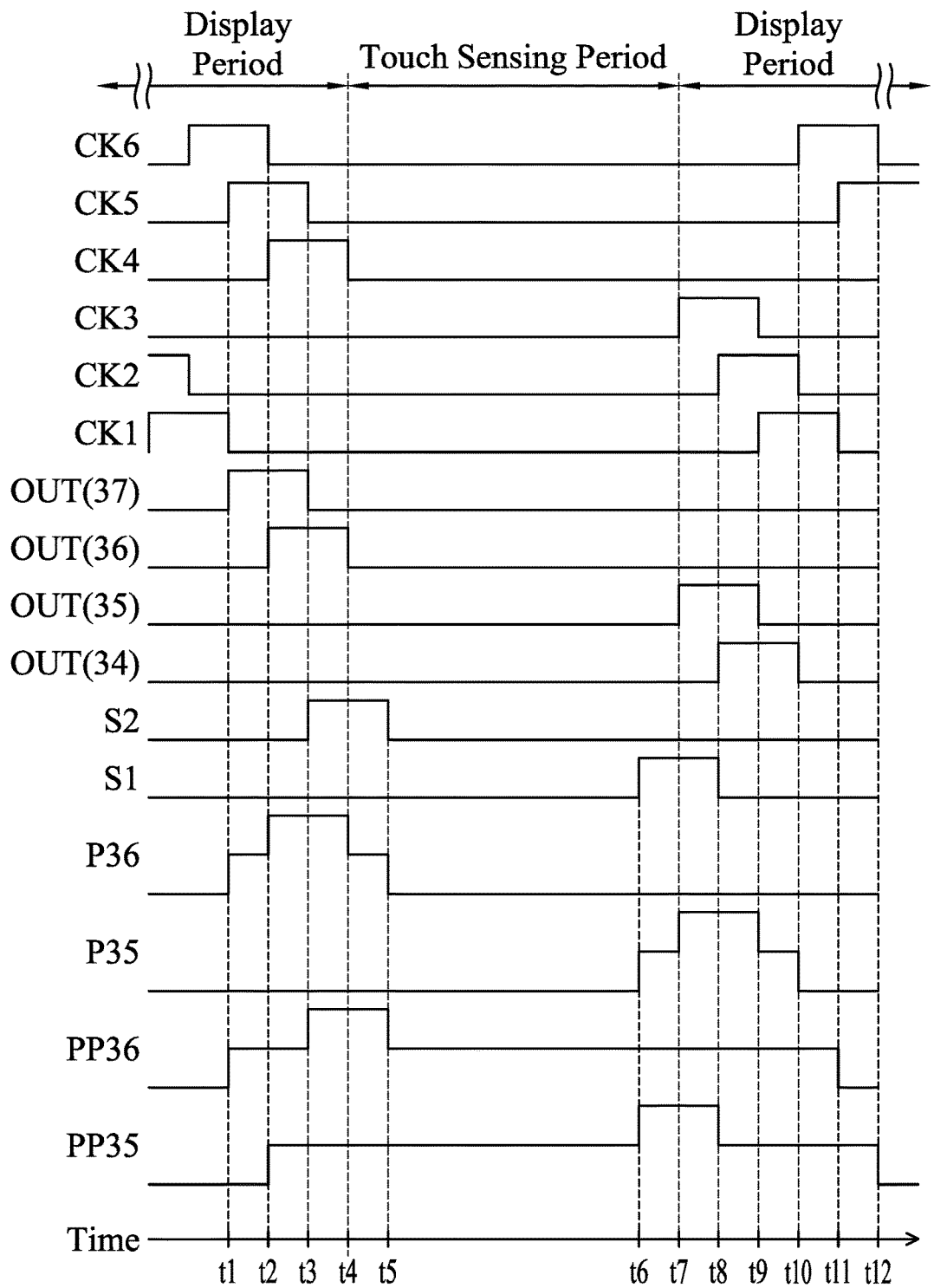
FIG. 12B is a timing diagram of the first compensation subcircuit shown in FIG. 10 and the second compensation subcircuit shown in FIG. 11.

In view of this, the compensation circuits, such as PHC[1] and PHC[2], maintain the transmission of the driving signals between the shift registers, even if the clock signals CK1 to CK6 are suspended or paused in the touch sensing period. Thus, during the touch sensing periods, output signals (i.e., the driving signals from the signal transmission terminals N or the output terminals OUT) of all output shift registers, such as SR[1] to SR[2K], have normal rising edges and normal falling edges without improper extension, so that the display quality of the touch display panel would not be degraded due to the touch sensing periods. In addition, the transistors MP4 and MP5 of the first compensation subcircuit SPHC1 are reset according to the driving signals OUT(38) and OUT(32) respectively, so that the control node PP35 is pulled low to the constant voltage VGL. The transistors MP9 and MP10 of the second compensation subcircuit SPHC2 are reset according to the driving signals OUT(39) and OUT(33) respectively, so that the control node PP36 is pulled low to the constant voltage VGL. FIG. 12B is a timing diagram showing clock signals and touch sensing periods when operating in the reverse scan. Operations of the gate driving circuit is similar to that illustrated in FIG. 12A, and thus, are omitted for brevity.

Figure 13:
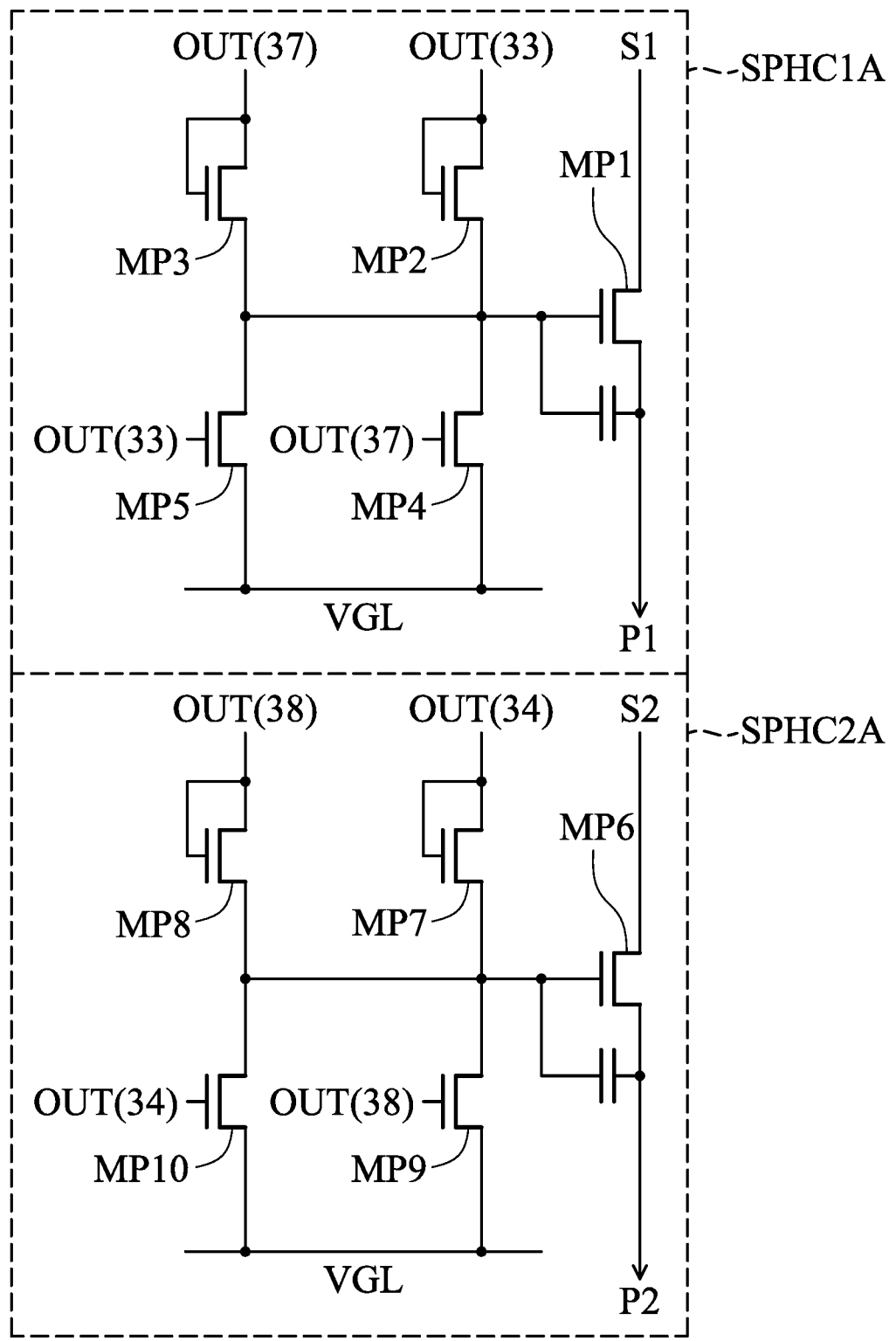
FIG. 13 shows another embodiment of the compensation circuit according to the prevent invention.

FIG. 13 shows another embodiment of the compensation circuit. As shown, the first compensation subcircuit SPHC1A is similar to the first compensation subcircuit SPHC1 shown in FIG. 10, the difference is that the transistors MP2 and MP5 are coupled to the driving signal OUT (33) and the transistors MP3 and MP4 are coupled to the driving signal OUT(37). Operations of the first compensation subcircuit SPHC1A are similar to that of the first compensation subcircuit SPHC1, and thus are omitted for brevity. The second compensation subcircuit SPHC2A is similar to the second compensation subcircuit SPHC2 shown in FIG. 10, the difference is that the transistors MP7 and MP10 are coupled to the driving signal OUT(34) and the transistors MP8 and MP9 are coupled to the driving signal OUT(38). Operations of the second compensation subcircuit SPHC2A are similar to that of the second compensation subcircuit SPHC2, and thus are omitted for brevity. In this embodiment, W is K−2, M is K−1, Y is K+3 and Z is K+2, but it is not limited thereto.

Figure 14:
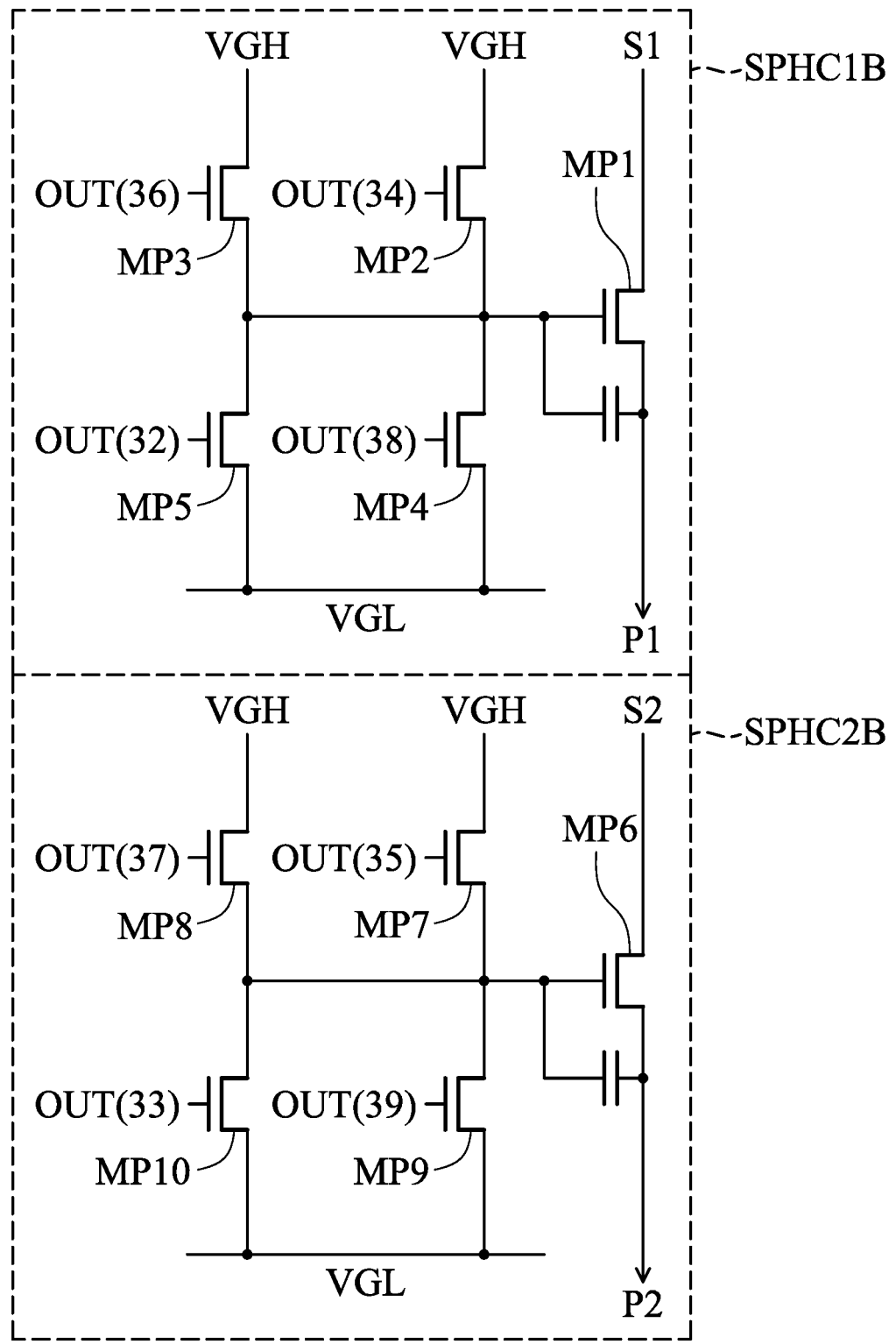
FIG. 14 shows another embodiment of the compensation circuit according to the prevent invention.

FIG. 14 shows another embodiment of the compensation circuit. As shown, the first compensation subcircuit SPHC1B is similar to the first compensation subcircuit SPHC1 shown in FIG. 10, the difference is that the first terminal of the transistor MP2 is coupled to a high voltage level VGH rather the driving signal OUT(34) and the first terminal of the transistor MP3 is coupled to the high voltage level VGH rather than the driving signal OUT(36). Operations of the first compensation subcircuit SPHC1B are similar to that of the first compensation subcircuit SPHC1, and thus are omitted for brevity. The second compensation subcircuit SPHC2B is similar to the second compensation subcircuit SPHC2 shown in FIG. 10, the difference is that the first terminal of the transistor MP7 is coupled to the high voltage level VGH rather the driving signal OUT(35) and the first terminal of the transistor MP8 is coupled to the high voltage level VGH rather than the driving signal OUT(37). Operations of the second compensation subcircuit SPHC2B are similar to that of the second compensation subcircuit SPHC2, and thus are omitted for brevity.

Figure 15:
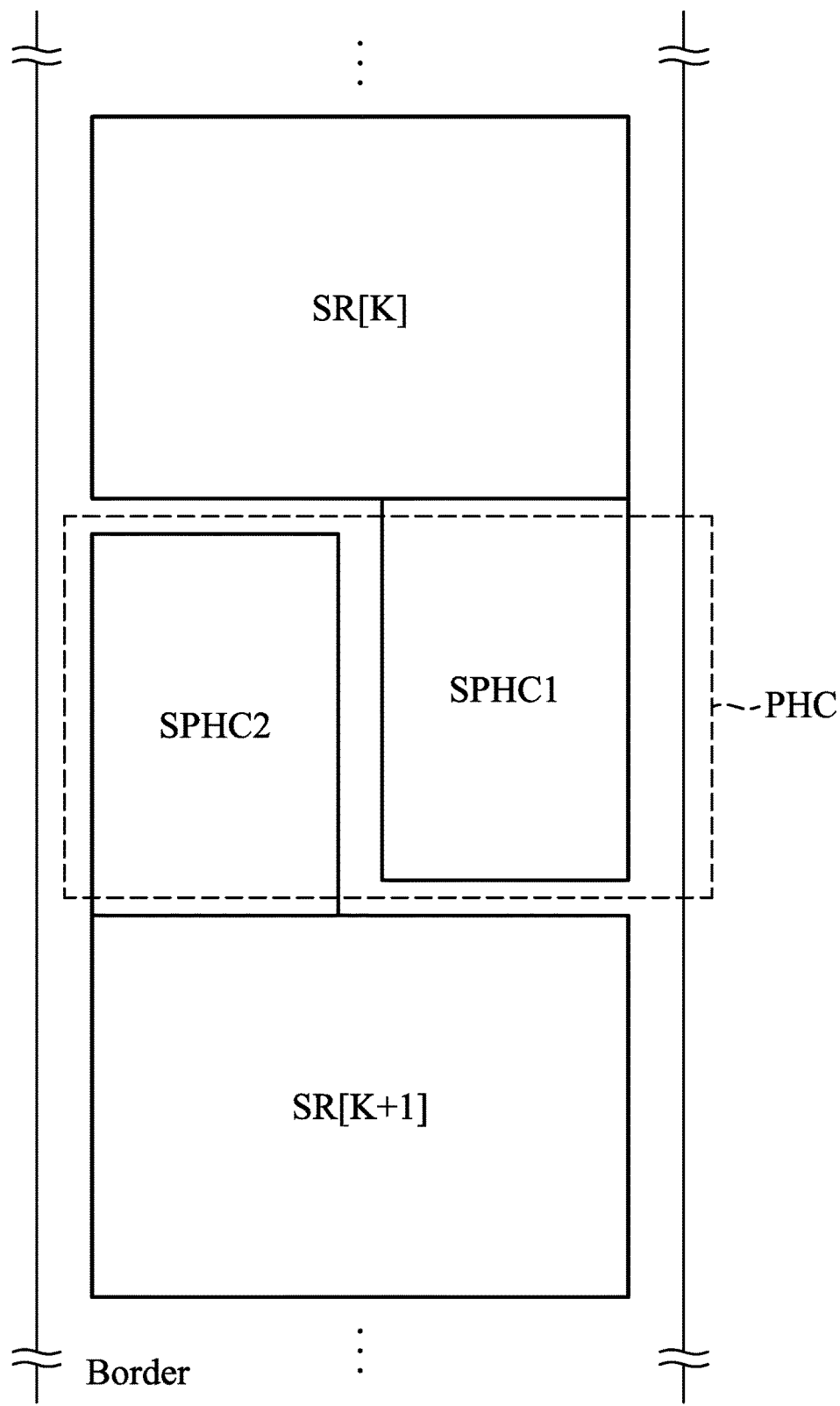
FIG. 15 is a routing diagram of the gate driving circuit according to the invention.

FIG. 15 is a routing diagram of the gate driving circuit in the present invention. As shown, the shift registers SR[K] and SR[K+1] are disposed on a border of the touch display panel 101 to output the gate driving signals in sequence. The compensation circuit PHC is disposed between the shift registers SR[K] and SR[K+1] on the border to prevent the rising edge and/or the falling edge of the gate driving signal of the shift registers SR[K] and SR[K+1] from being affected by the touch sensing period. The first compensation subcircuit SPHC1 of the compensation circuit PHC is integrated into the shift register SR[K] and the second compensation subcircuit SPHC2 of the compensation circuit PHC is integrated into the shift register SR[K+1]. In routing, because the elements in the first and second compensation subcircuits SPHC1 and SPHC2 are usually less than that in the shift register SR[K] and the first and second compensation subcircuits SPHC1 and SPHC2 are not required to be connected to gate lines, areas (or W/L ratio) for the elements in the first and second compensation subcircuits SPHC1 and SPHC2 can be smaller than that of the shift register SR[K]. Thus, the embodiment shown in FIG. 15 can reduce the routing area needed for the gate driving circuit by symmetrical circuit design, but it is not limited thereto. It should be noted that the operations of the shift register and the compensation circuit are same as that mentioned above, and thus, are omitted for brevity.

According to some embodiments, the compensation circuit is disposed between two adjacent shift registers. The compensation circuit enables one shift register to perform signal holding and enables the other shift register to perform pre-charging. Thus, a rising edge and/or falling edge of the gate driving signals generated by the two connected shift registers can be less affected by the touch sensing period of the touch display panel.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display system, comprising:
a touch display panel, comprising a pixel matrix with a plurality of pixels; and
a gate driving circuit, arranged to generate a plurality of gate driving signals to drive the pixels on the touch display panel according to a group of clock signals, wherein the gate driving circuit comprises:
a plurality of shift registers, arranged to output the plurality of the gate driving signals in sequence, wherein the plurality of the shift registers are divided into groups arranged in sequence, and in adjacent $N^{th}$ and $N+1^{th}$ groups of the shift registers of the groups, the gate driving signal from a first one of the $N+1^{th}$ group of the shift registers is next to the gate driving signal from a last one of the $N^{th}$ group of the shift registers;
at least one first compensation circuit, disposed between the adjacent $N^{th}$ and $N+1^{th}$ groups of the shift registers, and connected to the last one of the $N^{th}$ group of the shift registers and the first one of the $N+1^{th}$ group of the shift registers, wherein the at least one first compensation circuit provides a first control signal to enable the last one of the $N^{th}$ group of the shift registers to perform signal holding, and provides a second control signal to enable the first one of the $N+1^{th}$ group of the shift registers to perform pre-charging, wherein N is an integer greater than zero; and
a second compensation circuit connected to a last one of the plurality of the shift registers to provide a third control signal thereby enabling the last one of the plurality of the shift registers to perform the signal holding.

2. The image display system as claimed in claim 1, wherein the last one of the $N^{th}$ group of the shift registers is a $K^{th}$ shift register of the plurality of the shift registers and the first one of the $N+1^{th}$ group of the shift registers is a $K+1^{th}$ shift register of the plurality of the shift registers, and the gate driving signal from the $K^{th}$ shift register is not output to the $K+1^{th}$ shift register and the gate driving signal from the $K+1^{th}$ shift register is not output to the $K^{th}$ shift register, wherein K is an integer greater than zero, and can be the same as or different from N.

3. The image display system as claimed in claim 2, wherein, when the gate driving circuit is operated in a forward scan, the at least one first compensation circuit, during a touch sensing period, outputs a first signal to a reverse input terminal of the $K^{th}$ shift register according to the first control signal so that the $K^{th}$ shift register performs the signal holding, and outputs a second signal to a forward input terminal of the $K+1^{th}$ shift register according to the second control signal so that the $K+1^{th}$ shift register performs the pre-charging.

4. The image display system as claimed in claim 3, wherein, when the gate driving circuit is operated in a reverse scan, the at least one first compensation circuit during the touch sensing period, outputs the second signal to the forward input terminal of the $K+1^{th}$ shift register according to the second control signal so that the $K^{th}$ shift register performs the signal holding, and outputs the first signal to the reverse input terminal of the $K^{th}$ shift register according to the first control signal so that the $K^{th}$ shift register performs the pre-charging.

5. The image display system as claimed in claim 2, wherein the at least one first compensation circuit comprises a first compensation subcircuit and a second compensation subcircuit, each of the first and second compensation subcircuits has a first circuit and a second circuit, and when the gate driving circuit is operated in a forward scan, the first circuit of the first compensation subcircuit enables the $K^{th}$ shift register to perform the signal holding during a touch sensing period according to the gate driving signal from a $W^{th}$ shift register of the plurality of the shift registers and the first control signal, and the first circuit of the second compensation subcircuit enables the $K+1^{th}$ shift register to perform the pre-charging during the touch sensing period according to the gate driving signal from a $M^{th}$ shift register of the plurality of the shift registers and the second control signal, wherein W and M are positive integers, M is smaller than K+1, and W is smaller than K.

6. The image display system as claimed in claim 5, wherein, when the gate driving circuit is operated in a reverse scan, the second circuit of the second compensation subcircuit enables the $K+1^{th}$ shift register to perform the signal holding during the touch sensing period according to the gate driving signal from a $Y^{th}$ shift register of the plurality of the shift registers and the second control signal, and the second circuit of the first compensation subcircuit enables the $K^{th}$ shift register to perform the pre-charging during the touch sensing period according to the gate driving signal from a $Z^{th}$ shift register of the plurality of the shift registers and the first control signal, wherein Y and Z are positive integers, Y is greater than K+1, and Z is greater than K.

7. The image display system as claimed in claim 6, wherein the first compensation subcircuit comprises:
a first switch, having a first terminal coupled to the first control signal, and a second terminal coupled to a reverse input terminal of the $K^{th}$ shift register;
a second switch, coupled between a control terminal of the first switch and the gate driving signal of the $W^{th}$ shift register;
a third switch, coupled between the control terminal of the first switch and the gate driving signal of the $Z^{th}$ shift register;
a fourth switch, between the control terminal of the first switch and a constant voltage; and
a fifth switch, between the control terminal of the first switch and the constant voltage, wherein control terminals of the fourth and fifth switches are coupled to the corresponding gate driving signals, respectively.

8. The image display system as claimed in claim 7, wherein the second compensation subcircuit comprises:
a sixth switch, having a first terminal coupled to the second control signal, and a second terminal coupled to a forward input terminal of the $K+1^{th}$ shift register;
a seventh switch, coupled between the control terminal of the first switch and the gate driving signal of the $M^{th}$ shift register;
an eighth switch, coupled between the control terminal of the first switch and the gate driving signal of a $Y^{th}$ shift register;
a ninth switch, between the control terminal of the first switch and the constant voltage; and
a tenth switch, between the control terminal of the first switch and the constant voltage, wherein control terminals of the ninth and tenth switches are coupled to the corresponding gate driving signals, respectively.

9. The image display system as claimed in claim 1, wherein the touch display panel comprises:
the gate driving circuit, arranged to generate the plurality of the gate driving signals according to the group of clock signals;

a data transmission circuit, arranged to generate a plurality of data signals and provide the data signals to the pixels of the pixel matrix; and a control chip, arranged to provide the group of clock signals to control the plurality of the shift registers, wherein the control chip suspends or pauses the group of clock signals during touch sensing periods of the touch display panel.

10. A gate driving circuit generating a plurality of gate driving signals to drive pixels on a touch display panel according to a group of clock signals, the gate driving circuit comprising:

a plurality of shift registers, arranged to output the plurality of the gate driving signals in sequence, wherein the plurality of the shift registers are divided into groups arranged in sequence, and in adjacent $N^{th}$ and $N+1^{th}$ groups of the shift registers of the groups, the gate driving signal from a first one of the $N+1^{th}$ group of the shift registers is next to the gate driving signal from a last one of the $N^{th}$ group of the shift registers;

at least one first compensation circuit, disposed between the adjacent $N^{th}$ and $N+1^{th}$ groups of the shift registers, and connected to the last one of the $N^{th}$ group of the shift registers and the first one of the $N+1^{th}$ group of the shift registers, wherein the at least one first compensation circuit provides a first control signal to enable the last one of the $N^{th}$ group of the shift registers to perform signal holding, and provides a second control signal to enable the first one of the $N+1^{th}$ group of the shift registers to perform pre-charging, wherein N is an integer greater than zero; and a second compensation circuit connected to a last one of the plurality of the shift registers to provide a third control signal thereby enabling the last one of the plurality of the shift registers to perform the signal holding.

11. The gate driving circuit as claimed in claim 10, wherein the last one of the $N^{th}$ group of the shift registers is a $K^{th}$ shift register of the plurality of the shift registers and the first one of the $N+1^{th}$ group of the shift registers is a $K+1^{th}$ shift register of the plurality of the shift registers, and the gate driving signal from the $K^{th}$ shift register is not output to the $K+1^{th}$ shift register and the gate driving signal from the $K+1^{th}$ shift register is not output to the $K^{th}$ shift register, wherein K is an integer greater than zero, and can be the same or different from N.

12. The gate driving circuit as claimed in claim 11, wherein, when the gate driving circuit is operated in a forward scan, the at least one first compensation circuit, during a touch sensing period, outputs a first signal to a reverse input terminal of the $K^{th}$ shift register according to the first control signal so that the $K^{th}$ shift register performs the signal holding, and outputs a second signal to a forward input terminal of the $K+1^{th}$ shift register according to the second control signal so that the $K+1^{th}$ shift register performs the pre-charging.

13. The gate driving circuit as claimed in claim 12, wherein, when the gate driving circuit is operated in a reverse scan, the at least one first compensation circuit during the touch sensing period, outputs the second signal to the forward input terminal of the $K+1^{th}$ shift register according to the second control signal so that the $K^{th}$ shift register performs the signal holding, and outputs the first signal to the reverse input terminal of the $K^{th}$ shift register according to the first control signal so that the $K^{th}$ shift register performs the pre-charging.

14. The gate driving circuit as claimed in claim 11, wherein the at least one first compensation circuit comprises a first compensation subcircuit and a second compensation subcircuit, each of the first and second compensation subcircuits has a first circuit and a second circuit, and when the gate driving circuit is operated in a forward scan, the first circuit of the first compensation subcircuit enables the $K^{th}$ shift register to perform the signal holding during a touch sensing period according to the gate driving signal from a $W^{th}$ shift register of the plurality of the shift registers and the first control signal, and the first circuit of the second compensation subcircuit enables the $K+1^{th}$ shift register to perform the pre-charging during the touch sensing period according to the gate driving signal from a $M^{th}$ shift register of the plurality of the shift registers and the second control signal, wherein W and M are positive integers, M is smaller than K+1, and W is smaller than K.

15. The gate driving circuit as claimed in claim 14, wherein, when the gate driving circuit is operated in a reverse scan, the second circuit of the second compensation subcircuit enables the $K+1^{th}$ shift register to perform the signal holding during the touch sensing period according to the gate driving signal from a $Y^{th}$ shift register of the plurality of the shift registers and the second control signal, and the second circuit of the first compensation subcircuit enables the $K^{th}$ shift register to perform the pre-charging during the touch sensing period according to the gate driving signal from a $Z^{th}$ shift register of the plurality of the shift registers and the first control signal, wherein Y and Z are positive integers, Y is greater than K+1, and Z is greater than K.

16. The gate driving circuit as claimed in claim 15, wherein the first compensation subcircuit is integrated into the $K^{th}$ shift register and the second compensation subcircuit is integrated into the $K+1^{th}$ shift register.

17. The gate driving circuit as claimed in claim 15, wherein the first compensation subcircuit comprises:

a first switch, having a first terminal coupled to the first control signal, and a second terminal coupled to a reverse input terminal of the $K^{th}$ shift register;

a second switch, coupled between a control terminal of the first switch and the gate driving signal of the $W^{th}$ shift register;

a third switch, coupled between the control terminal of the first switch and the gate driving signal of the $Z^{th}$ shift register;

a fourth switch, between the control terminal of the first switch and a constant voltage; and a fifth switch, between the control terminal of the first switch and the constant voltage, wherein control terminals of the fourth and fifth switches are coupled to the corresponding gate driving signals.

18. A gate driving circuit disposed on a touch display panel, wherein the gate driving circuit comprises:

a $K^{th}$ shift register, disposed on a border of the touch display panel to output a $K^{th}$ gate driving signal;

a $K+1^{th}$ shift register, disposed on the border to output a $K+1^{th}$ gate driving signal; and a first compensation circuit, disposed on the border to prevent a rising edge and/or a falling edge of the $K^{th}$ gate driving signal from the $K^{th}$ shift register and the $K+1^{th}$ gate driving signal from the $K+1^{th}$ shift register from being affected by a touch sensing period of the touch display panel, wherein K is an integer greater than zero, the first compensation circuit comprises a first compensation subcircuit and a second compensation subcircuit, and the first and second compensation subcircuits are integrated into the $K^{th}$ shift register and the $K+1^{th}$ shift register respectively.

* * * * *